United States Patent
Borko et al.

(10) Patent No.: US 11,608,193 B2
(45) Date of Patent: Mar. 21, 2023

(54) UAV RETRIEVAL AND DEPLOYMENT SYSTEM

(71) Applicant: SENTIEN ROBOTICS, INC., Arlington, VA (US)

(72) Inventors: Brandon Borko, Manassas, VA (US); Dan Carrier, Arlington, VA (US); Felipe Melivilu, Winchester, VA (US)

(*) Notice: Subject to any disclaimer, the term of this patent is extended or adjusted under 35 U.S.C. 154(b) by 1254 days.

(21) Appl. No.: 16/042,524

(22) Filed: Jul. 23, 2018

(65) Prior Publication Data

US 2019/0023416 A1    Jan. 24, 2019

Related U.S. Application Data

(60) Provisional application No. 62/535,765, filed on Jul. 21, 2017.

(51) Int. Cl.
| | | |
|---|---|---|
| *B65G 1/04* | (2006.01) | |
| *B64F 1/22* | (2006.01) | |
| *B66C 7/08* | (2006.01) | |
| *G06F 3/041* | (2006.01) | |
| *H01L 27/32* | (2006.01) | |

(52) U.S. Cl.
CPC ............ *B64F 1/222* (2013.01); *B65G 1/0435* (2013.01); *B65G 1/0485* (2013.01); *B66C 7/08* (2013.01); *G06F 3/041* (2013.01); *B64C 2201/201* (2013.01); *B64C 2201/208* (2013.01); *G06F 2203/04102* (2013.01); *H01L 27/32* (2013.01); *H01L 2251/5338* (2013.01)

(58) Field of Classification Search
CPC ........................... B65G 1/0435; B65G 1/0485
See application file for complete search history.

(56) References Cited

U.S. PATENT DOCUMENTS

| | | | | |
|---|---|---|---|---|
| 9,505,493 | B2* | 11/2016 | Borko | B64F 1/0297 |
| 9,776,717 | B2* | 10/2017 | Spinelli | B64F 1/222 |
| 9,777,502 | B2* | 10/2017 | Curlander | B64C 39/024 |
| 10,625,938 | B2* | 4/2020 | Horii | H01L 21/67733 |
| 2010/0307989 | A1* | 12/2010 | Hanel | B65G 1/0407 |
| | | | | 211/79 |
| 2014/0109516 | A1* | 4/2014 | Tominaga | H01L 21/67733 |
| | | | | 53/510 |
| 2016/0009413 | A1 | 1/2016 | Lee et al. | |
| 2017/0129464 | A1* | 5/2017 | Wang | B64C 39/024 |

FOREIGN PATENT DOCUMENTS

| | | |
|---|---|---|
| CN | 106503954 | 3/2017 |
| CN | 106542109 | 3/2017 |
| WO | WO2016015301 | 2/2016 |
| WO | WO2016059555 | 4/2016 |

* cited by examiner

*Primary Examiner* — Jonathan Snelting
(74) *Attorney, Agent, or Firm* — Patrick Stanzione; Stanzione & Associates PLLC

(57) ABSTRACT

Provided is a system including a platform to receive unmanned air vehicles (UAVs) thereon for launching and retrieving the UAVs. The system can include a pair of gantry arms that move to any location along the platform to position a UAV as desired. The platform includes a door that can open to expose a storage area in the system to receive and store UAVs, as well as to re-charge power in the UAVs. The storage area can include a plurality of cells that can be adjusted to receive a UAV of any size for storage therein.

18 Claims, 29 Drawing Sheets

FIG. 6B
REPLACEMENT SHEET
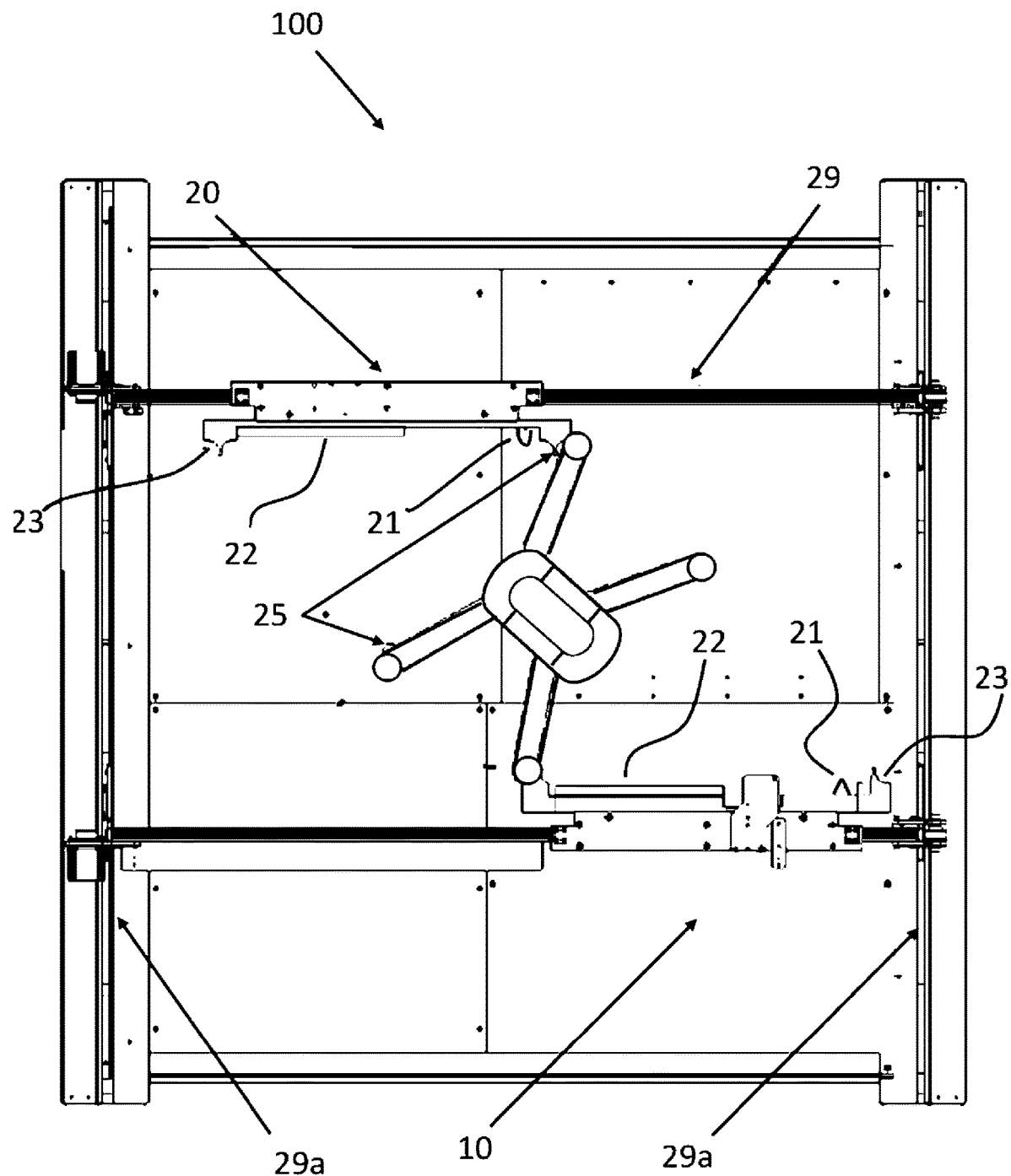

FIG. 10A
REPLACEMENT SHEET
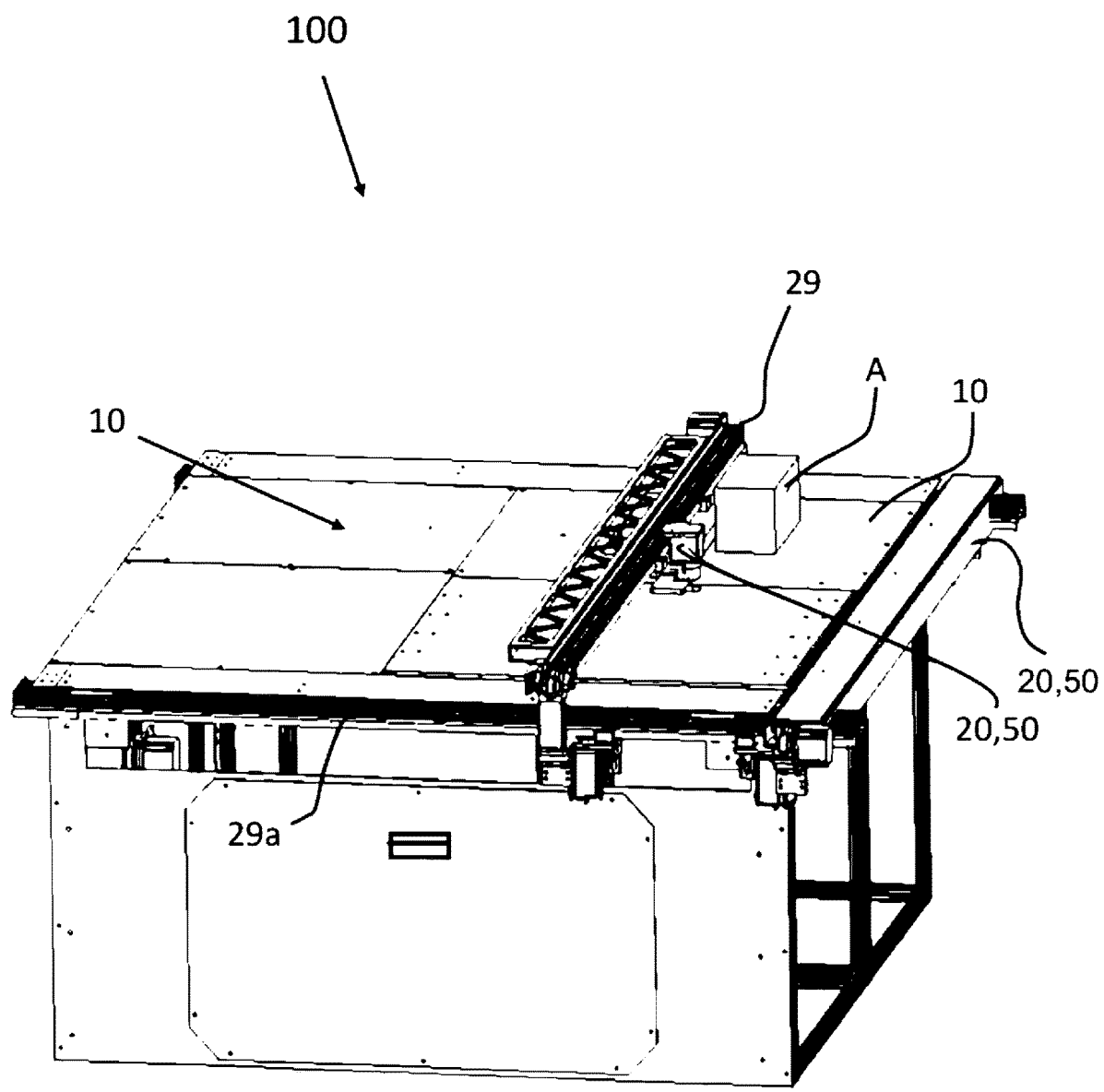

FIG. 12A
REPLACEMENT SHEET
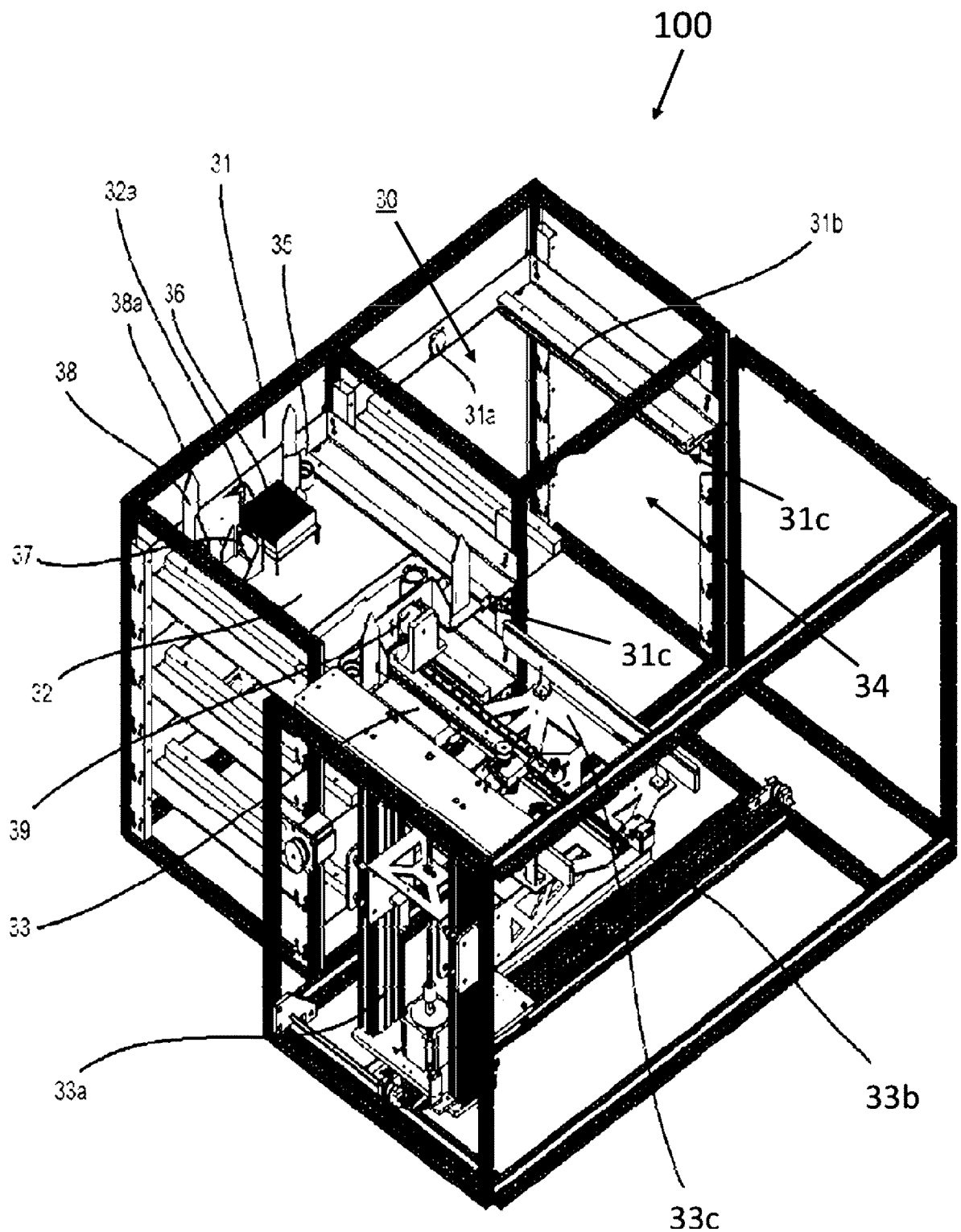

FIG. 12B
REPLACEMENT SHEET
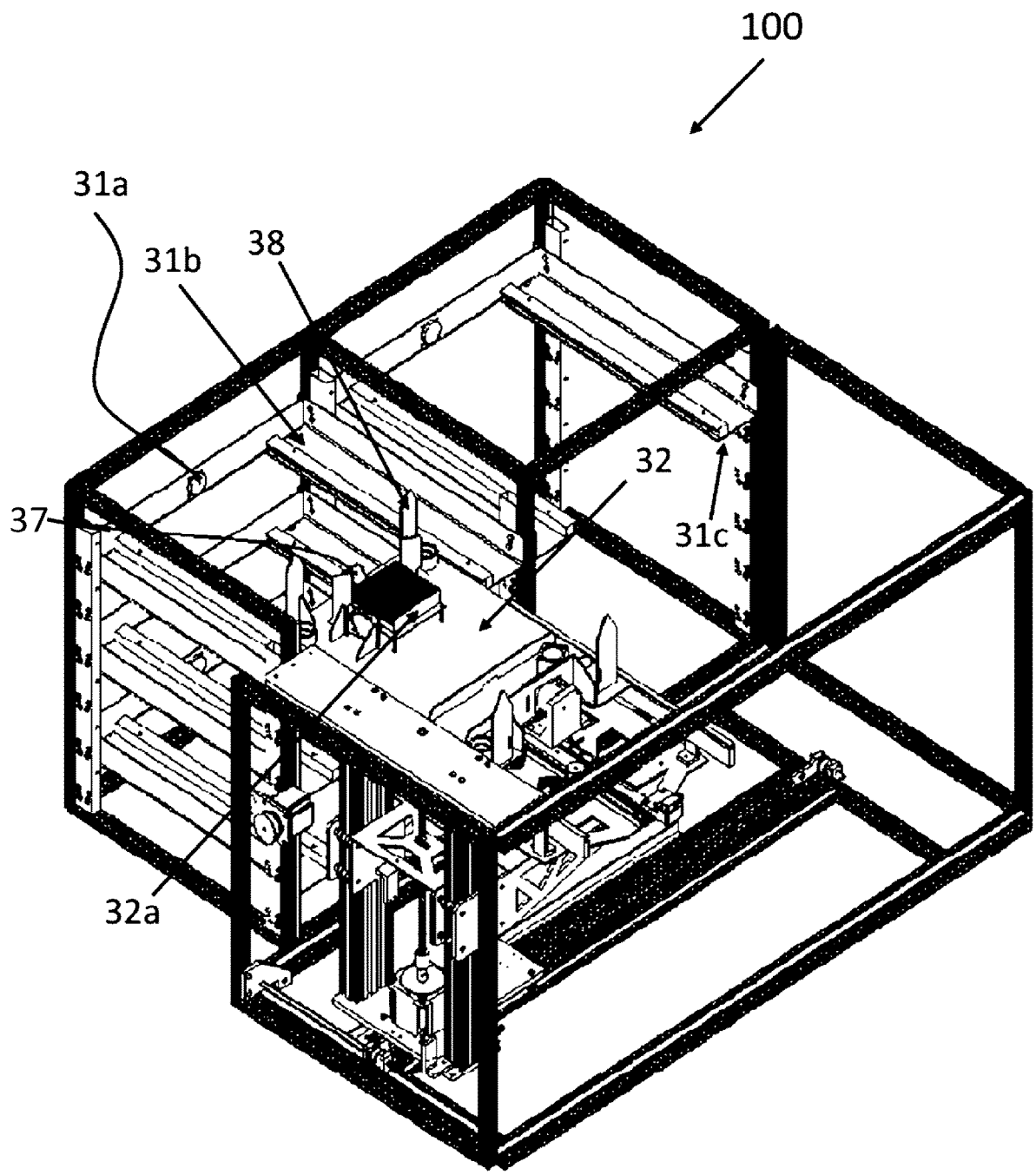

UAV RETRIEVAL AND DEPLOYMENT SYSTEM

REFERENCE TO RELATED APPLICATIONS

This application claims the benefit of Provisional Application No. 62/535,765, filed Jul. 21, 2017, entitled "UAV RETRIEVAL AND DEPLOYMENT SYSTEM." The benefit under 35 USC § 119(e) of the United States provisional application is hereby claimed, and the aforementioned application is hereby incorporated herein by reference in its entirety.

BACKGROUND OF THE INVENTION

Field of the Invention

The invention pertains to the field of unmanned air vehicles, also knows as drones. More particularly, the invention pertains to a system to launch, retrieve, store and communicate information with unmanned air vehicles.

Description of Related Art

Small unmanned air vehicles (UAVs), also known as unmanned aerial systems (UASs) or drones, have been used in photography, surveillance, sensing and mapping applications, payload delivery, and many other uses. The use of small UAVs provides capabilities for tasks that require cameras or payloads to be present in all types of locations, including those that are dangerous or difficult to access.

Small UAVs are often electric vehicles with flight time that is limited by battery capacity. When a UAV's battery is near being depleted, the operator or mission control software must end the task, fly the vehicle to a service location, land, swap or recharge the battery, fly the vehicle back to the location, and then resume the task. This operational cycle is tedious and time-consuming for a human to be involved.

Moreover, small UAVs, whether fully autonomous or piloted remotely with a human or computer operator, are deployed by the human operator and managed by human operators while not in use. This requirement of human deployment and management is cumbersome, inefficient and time consuming, especially when dealing with multiple vehicles simultaneously, and may be prohibitive when dealing with a large number of vehicles. In addition, the deployment and retrieval of small UAVs, including startup placement, battery and fuel management, and mission initiation requires an informed operator to be present. Accordingly, a fully automated system of deploying, landing/retrieving and recharging UAVs is needed.

Existing methods for automated retrieval of UAVs exist with various disadvantages. Certain retrieval methods known in the art, such as net-type or vertical wire systems, require a human to disengage the UAV from the retrieval system, require a separate launching mechanism, and have a high probability of damage. In the case of a passive retrieval system (e.g., a landing pad), existing autonomous UAV retrieval requires intelligence to be present on the UAV itself to align with a landing pad and attempt to maintain alignment throughout the retrieval process. However, due to their relatively small size, UAVs have limited processing power and intelligence sensing capability to be present onboard, making such a retrieval procedure difficult for a UAV to manage on its own. In addition, conditions such as high or turbulent winds, a dynamic moving platform (e.g., a retrieval system supported on a moving vehicle), and the like, may cause a failure to maintain alignment and failure to land precisely. In the case of a retrieval system supported on a moving vehicle, failure to land successfully on the retrieval system (e.g., missing the landing pad) may cause the UAV to crash, thus damaging or destroying it. Still further, even after successfully landing on such a retrieval system, a UAV may be thrown off the system by motion of the vehicle carrying the system, thereby damaging the UAV or losing it entirely. For example, if the UAV is attempted to be retrieved by way of a boat, the UAV has a high chance of falling overboard, thus losing or destroying the UAV. Similar results can occur if attempting to retrieve a UAV on a high speed moving vehicle.

Currently, limited sensing capabilities on small UAVs requires operators to manually land and deploy small UAVs, because of uncertainty of an autonomous vehicle (such as a UAV) about retrieval conditions. Ground slope, tall grass, water, windy conditions, and motion of the retrieval system create hazards and uncertainty that could cause UAV damage. Software algorithms exist to land UAVs automatically by slowly reducing altitude in small increments until a hard stop is detected, if the operator selects a suitable landing zone beforehand. This is not ideal because flight time is limited, and therefore the operator must think about and select a landing location beforehand, and the UAV still has to be handled by an operator after it has landed. If the operator wants to hold a position or fly an autonomous mission, the UAV is typically manually deployed and then switched into the computer-controlled mode.

The relatively short operational range of small UAVs means that a UAV must be deployed in approximately the same area it is to be operated, and cannot fly in from a more remote location. Accordingly, conventional UAVs require a human operator to be present in the same area the UAVs are operated in, so that the operator may deploy and retrieve the UAVs. This presents its own difficulties, since UAVs are often operated in hostile conditions, for example in extreme climates or combat zones, where it is dangerous for a human operator to be present. Also, UAVs are sometimes required to be operated in humanly difficult or impossible terrain, where such terrain is desired to be explored.

Accordingly, a system to automate the retrieval and deployment of UAVs is needed. Further needed is a system to automate the retrieval and deployment of UAVs which can account for dynamic motion of the platform, and furthermore can store UAVs and hold them in place in between retrieval and deployment, as well as re-charging them during storage.

SUMMARY OF THE INVENTION

The forgoing and or other features and utilities of the present inventive concept can be achieved by providing a system to manage unmanned air vehicles (UAVs); including: an enclosed storage area including at least one cell formed therein to receive and store at least one UAV; a platform to receive a UAV from a flight and to support a UAV for launching, the platform including an electronic door to act as a part of the platform, the door being configured to withdraw from the platform to create an opening in the platform to allow UAVs to enter and exit the storage area; and a pair of gantry arms movable to pickup and position a UAV anyplace along the platform.

In accordance with an exemplary embodiment, the system can further include a first pair of guide rails to guide movement of the pair of gantry arms across the platform; and a second pair of guide rails disposed at opposite ends of the platform to guide movement of the pair of gantry arms across the platform in a direction perpendicular to the direction in which the first pair of guide rails guide movement of the gantry arm.

In accordance with another exemplary embodiment, the gantry arms can include a pair of notches with a point therebetween at each end thereof to capture feet of a UAV disposed on the platform; an alignment pin adjacent one pair of notches and the point to capture a foot of the UAV therein; and a blade disposed adjacent to the other pair or notches and the point to engage with slots in the feet of a UAV, the blade being angled to lift the feet by a predetermined amount.

In accordance with another exemplary embodiment, the gantry arms can include a pair of notches with a point therebetween at each end thereof to capture feet of a UAV on the platform; a wedge adjacent one pair of notches and the point to capture a foot of the UAV therein; and a blade disposed adjacent to the other pair or notches and the point to engage with slots in the feet of a UAV, the blade being angled to lift the feet by a predetermined amount In accordance with still another exemplary embodiment, the door can drop down by a predetermined amount with respect to the platform and then can slide thereunder along tracks.

In accordance with still another exemplary embodiment, the first pair of guide rails can glide along a length of the second pair of guide rails to move the corresponding arms along the second pair of guide rails.

In accordance with yet another exemplary embodiment, a chute can be disposed at one side of the system to capture an object that is removed from the platform by the gantry arms.

In accordance with yet another exemplary embodiment, the storage area comprises a plurality of cells vertically aligned, each cell to receive and store a UAV therein.

In accordance with still another exemplary embodiment, each cell can include a pair of rails disposed at opposite sides thereof, each rail including a slot therein and a tray to securely connect a UAV thereon, the tray being configured to slide along the slot in the pair of rails to place the UAV with the cell and withdraw the UAV from the cell.

In accordance with yet another exemplary embodiment, one of each pair of rails includes a locking mechanism within the slot, the locking mechanism including a cam to rotate to an open position to allow the tray to slide past the locking mechanism and into the cell and to rotate to a lock position where a contact area thereof extends out of the slot to contact and lock the tray from sliding out of the cell.

In accordance with yet another exemplary embodiment, the locking mechanism can further include a lever disposed at one end of the rail where the tray enters the cell, the lever being configured to prevent the cam from rotating to the open position; and an unlocking linkage disposed at the one end of the rail and adjacent the lever, the unlocking linkage including a spring to bias the unlocking linkage away from the lever, the unlocking linkage being configured such that when a force greater than a force of the spring is applied thereto, the unlocking linkage forces the lever to move to a position to release the cam such that the cam rotates to the open position such that the tray can be withdrawn from the cell.

In accordance with yet another exemplary embodiment, the storage area can further include a manipulator to manipulate a tray between any of the cells and the opening in the platform, the manipulator being configured to move a tray to a position within the opening such that the gantry arms can engage with the feet of a UAV disposed on the tray.

In accordance with yet another exemplary embodiment, the manipulator can further include a transport plate to receive the tray; an elevator to raise and lower the transport plate between the opening in the platform and a position adjacent to each of the cells vertically aligned; and a pair of rails that move with the elevator, the rails being configured such that the transport plate can slide along the rails horizontally between a position directly under the opening to a position between the pairs of rails within each of the cells.

In accordance with yet another exemplary embodiment, the system can further include an electronic controller to control the moves of the first and second pair of guide rails, the door and the manipulator.

In accordance with yet another exemplary embodiment, the electronic controller can be connected to the system physically and with wires.

In accordance with yet another exemplary embodiment, the electronic controller can be remote from the system physically and is wirelessly connected to the system.

The forgoing and or other features and utilities of the present inventive concept can also be achieved by providing a method of managing unmanned air vehicles (UAVs), the method including: providing an enclosed system including a platform in which a UAV can be launched and retrieved therefrom, the platform having a section thereof that is movable to create an opening in the platform to expose a storage area within the enclosed system to receive a UAV; moving a UAV to any desired location on the platform and over the opening with a pair of movable gantry arms.

In accordance with an exemplary embodiment, the method can further include providing a manipulator device to receive a UAV through the opening and to move the UAV vertically within the storage area and horizontally within the storage area, the UAVs being moved horizontally within the storage area to be placed in one of a plurality of cells within the storage area.

The forgoing and or other features and utilities of the present inventive concept can also be achieved by providing a system to manage unmanned air vehicles (UAVs), including: an enclosed frame including a plurality of movable cells formed therein, each cell being movable to be enlarged or made smaller to fit different size UAVs; a platform disposed on a top portion of the enclosed frame to receive UAVs upon landing and to support a UAV to be launched, the platform including one portion thereof that is configured to withdraw from the rest of the platform to create an opening to allow UAVs to enter and exit the enclosed frame; and a pair of gantry arms movable along the platform to pickup a resting UAV and position the picked up UAV to anyplace along the platform or over the opening.

In accordance with an exemplary embodiment, the system can further include a manipulator device to receive a UAV through the opening and move the UAV in vertical and horizontal directions within the enclosed frame and to place a received UAV into a cell corresponding with a size of the UAV.

BRIEF DESCRIPTION OF THE DRAWING

FIG. 6B illustrates another top view of the exemplary embodiment of FIG. 1 in operation; illustrates another top view of the exemplary embodiment of FIG. 1 in operation;

FIG. 10A illustrates yet another perspective view of the system according to the exemplary embodiment of FIG. 1 in operation;

FIG. 12A illustrates an internal view of a system to launch, retrieve, store and communicate with unmanned air vehicles (UAVs) according to another exemplary embodiment of the present inventive concept;

FIG. 12B illustrates another internal view of the system according to the exemplary embodiment of FIG. 12A;

DETAILED DESCRIPTION OF THE INVENTION

Figure 1:
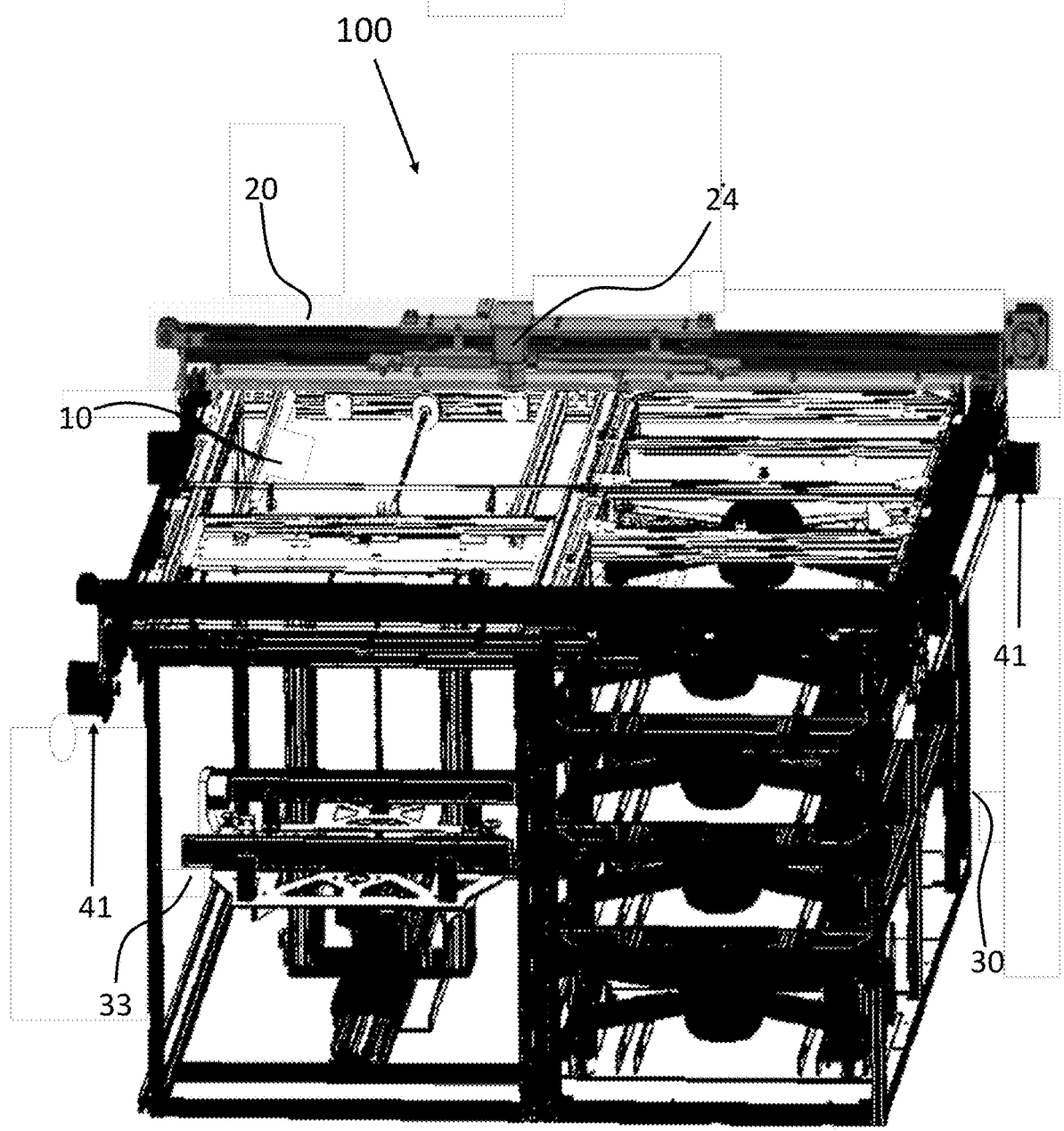
FIG. 1 illustrates a plan view of a system to launch, retrieve, store and communicate with unmanned air vehicles (UAVs) according to an exemplary embodiment of the present inventive concept.

The terms "UAV" and "UAV," as defined above, may be used interchangeably in this description.

Directional terms such as "up," "down," "above," "below," etc., are used to describe a component's position relative to other components. Unless otherwise indicated, these terms refer to the relative orientation of the components as illustrated in the drawings, and are not to be considered as defined with respect to ground.

A "communication link", as used in this disclosure, means a wired and/or wireless medium that conveys data or information between at least two points. The wired or wireless medium may include, for example, a metallic conductor link, a radio frequency (RF) communication link, an Infrared (IR) communication link, an optical communication link, or the like, without limitation. The RF communication link may include, for example, Wi-Fi, WiMAX, IEEE 802.11, DECT, OG, 1G, 2G, 3G or 4G cellular standards, Bluetooth, and the like.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

FIG. 1 illustrates a UAV retrieval and deployment system 100 in accordance with an exemplary embodiment of the present inventive concept. The UAV retrieval and deployment system 100 illustrated in FIG. 1 is a modular system that can automate the entire operational cycle of one or more UAVs, including the operations of storage, power management, deployment, recovery, servicing, and strategic coordination to enable persistent operations over a wide geographic area.

The UAV retrieval and deployment system 100 according to an exemplary embodiment may further provide a high-level command and control interface to operators without requiring the operator to directly interact with UAV hardware to execute long duration missions requiring multiple recharge cycles per UAV. Therefore, the UAV retrieval and deployment system 100 can automate deployment, recovery, and recharge of the UAV assets to maintain mission performance and objectives.

The UAV retrieval and deployment system 100 according to an exemplary embodiment may also provide a storage system to manage and service a plurality of UAVs simultaneously.

As illustrated in FIG. 1, the reception and deployment system 100 may include a platform 10 to act as a landing and launching area, a plurality of gantry arms 20, and a storage area 30 to store at least one UAV. As will be described in more detail infra, the storage area 30 can easily be reconfigured to contain a plurality of UAVs or fewer larger UAVs.

Figure 2:
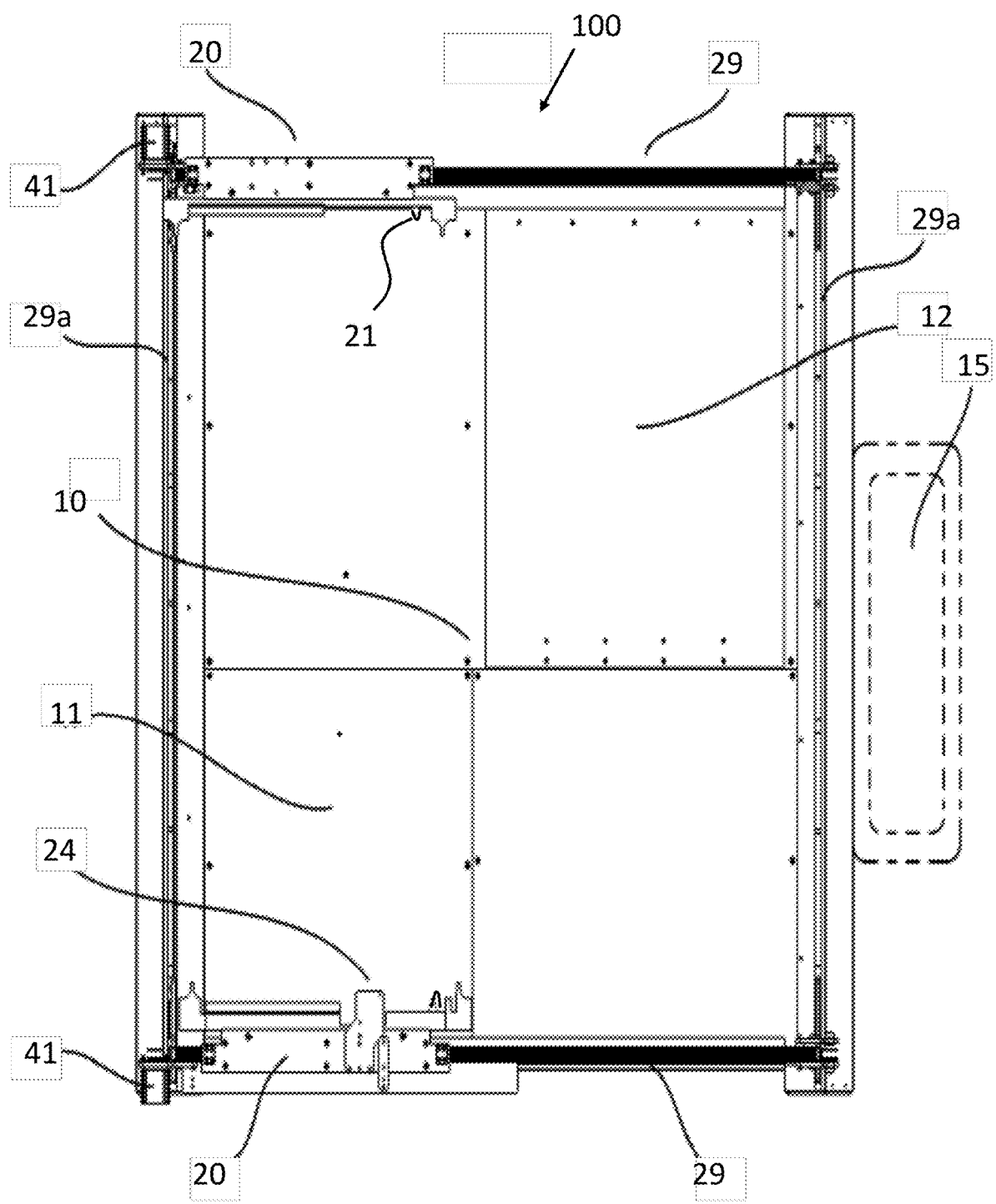
FIG. 2 illustrates a top view of the system according to FIG. 1.

The platform 10 is preferably a substantially flat surface, for example a landing pad. The platform 10 may be any size, and is preferably square or rectangular in shape. However, other shapes may be used according to the particular embodiment. Referring to FIG. 2, the platform 10 preferably includes a static area 11 and a door 12. The static area 11 may be a solid area held firmly in place, for example a special type adhesive, bolts, rivets, and/or screws, such that the static area 11 may not move relative to the rest of the system 100.

Figure 3:
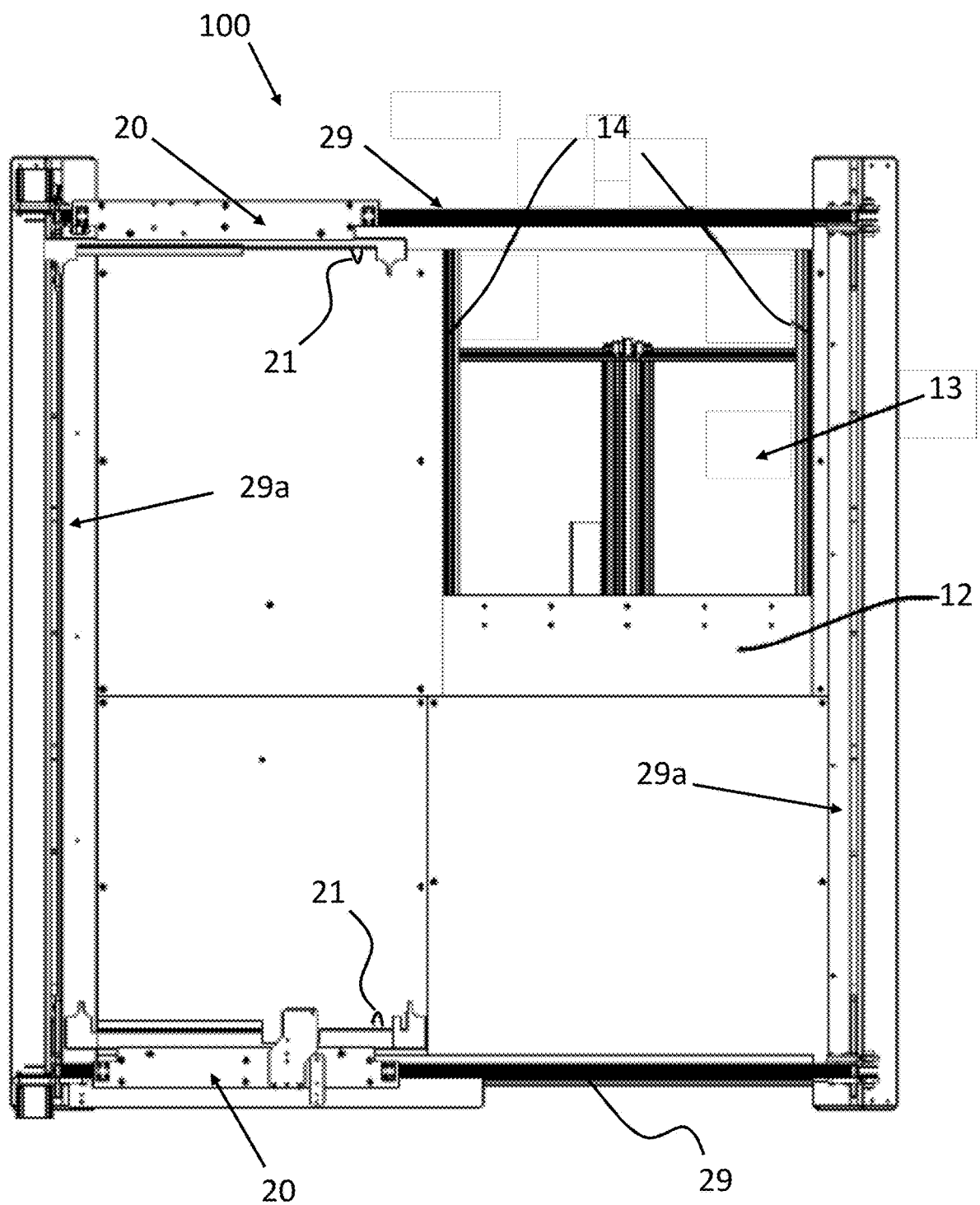
FIG. 3 illustrates another top view of the system according to FIG. 1.

The door 12 may be a panel that can serve as part of the platform 10, while being able to move relative to the static area 11. As illustrated in FIGS. 2 through 3, the door 12 may move between a closed position in which the door 12 is flush with the static area 11 (FIG. 2) and an open position in which the door 12 is retracted to form an opening 13 in the platform 10 (See FIG. 3, illustrating the door 12 in the process of opening). While moving from the closed position to the open position, the door 12 may be lowered by a predetermined amount such that the plane of the door 12 is below the static area 11, such that the door 12 may then be retracted, for example slid underneath the static area 11, to form an opening 13. The same operations may be performed in reverse to close the opening 13 and reposition the door 12 to perform as part of the platform 10. In an example embodiment, as the door 12 is moved to the position where the opening 13 is fully covered, the door 12 can then be raised to be flush with the static area 11. This form of closing ensures a tight seal with weatherproof gaskets 14, which may be formed around the opening 13, and furthermore avoids causing any damage to the gaskets 14 that could otherwise occur by lateral movement of the door 12.

The function of the opening 13 is to allow UAVs to pass therethrough to enter or exit the storage area 30, described in detail below. The size of the door 12 may be approximately equal to the opening 13 made when the door 12 is completely open. The size of the door 12 (and the corresponding opening 13) may be made to accommodate UAVs intended to be handled by the system 100. For example, if the system 100 is made to handle relatively small UAVs, the door 12 can be made large enough that the small UAVs can pass through the opening 13 sized relative to the door 12, while relatively larger UAVs may not. Alternatively, the door 12 can be made large enough to accommodate any range of UAV sizes.

In exemplary embodiments of the present inventive concept, the area of the door 12 can correspond to between one quarter and one half of the total area of the platform 10, such that the door 12 can be retracted as described above to be completely retracted underneath the static area 11 so as not to interfere with UAVs being moved to or from the storage area 30 (described in detail below). However, the door 12 may take up any portion of the platform 10 as desired in order to perform the intended purposes as described herein.

In the exemplary embodiment illustrated in FIGS. 1 and 2, two gantry arms 20 are illustrated. The gantry 20 arms are preferably mounted to respective tracks 29 extending along the length of two opposing sides of the platform 10 and are configured to move across the width of the platform 10, for example along rails 29a, such that the gantry arms 20 may be moved in the tracks 29 in a direction substantially perpendicular to the tracks 29 to engage with an object (e.g., a UAV) that is positioned any location on the platform 10. In a "home" position as illustrated in FIGS. 1 and 2, or the position when not in use, the gantry arms 20 may be positioned at the two opposite edges of the platform 10, so as to leave the platform 10 unobstructed for a UAV to land freely on the platform 10. The gantry arms 20 serve to manipulate a UAV after it has landed on the platform 10, to accurately lock the UAV in place to keep the UAV from sliding off of the platform 10 and to allow the UAV to be moved to a desired location on the platform 10, for example over the door 12. The gantry arms 20 may also orient a UAV to be stored in accordance with a process described below. Furthermore, the gantry arms 20 can manipulate a UAV to a position in on the platform 10 in preparation for deployment, i.e. takeoff.

Figure 7A:
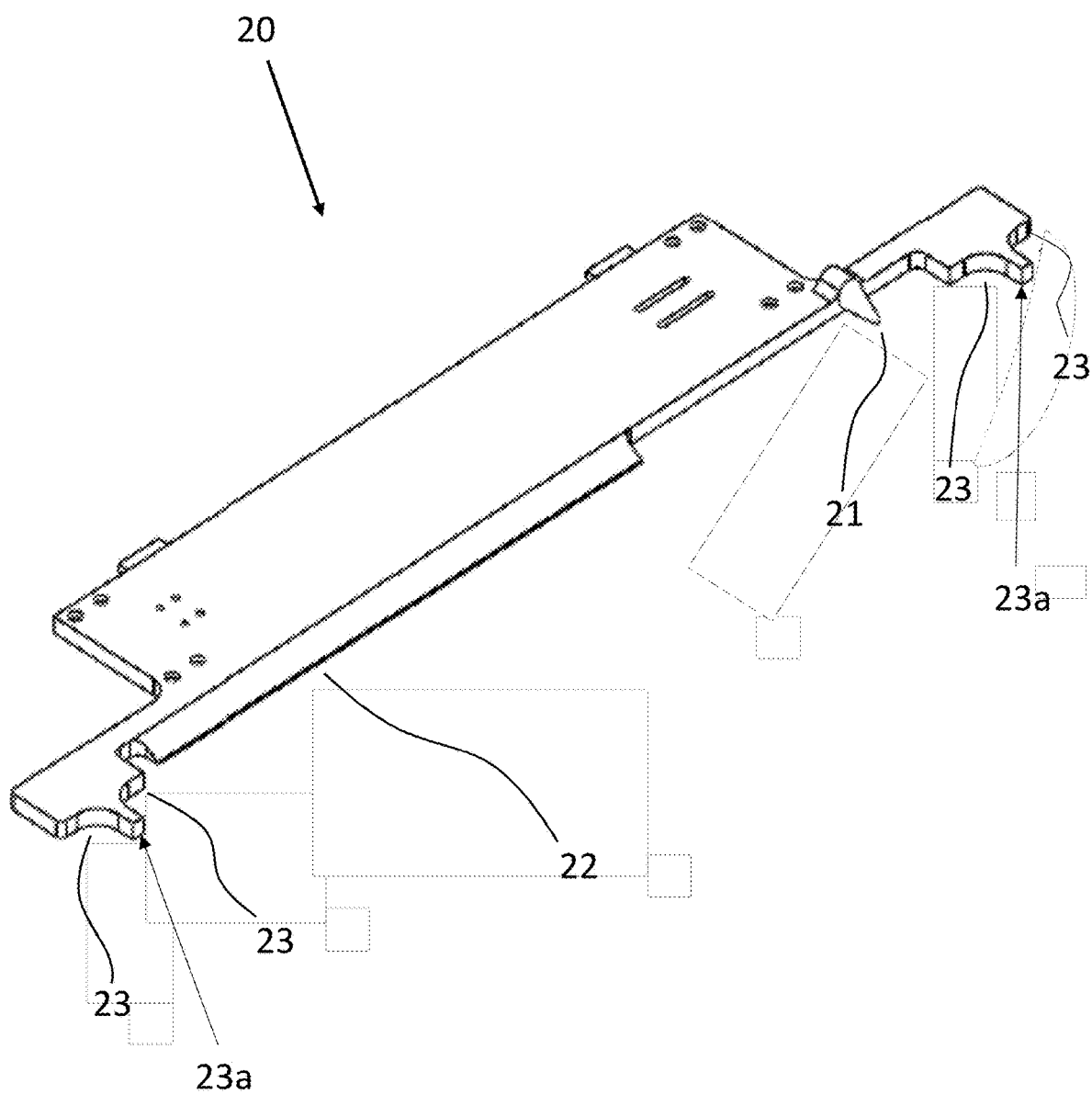
FIG. 7A illustrates a perspective view of a gantry arm in accordance with an exemplary embodiment of the present inventive concept.
Figure 7B:
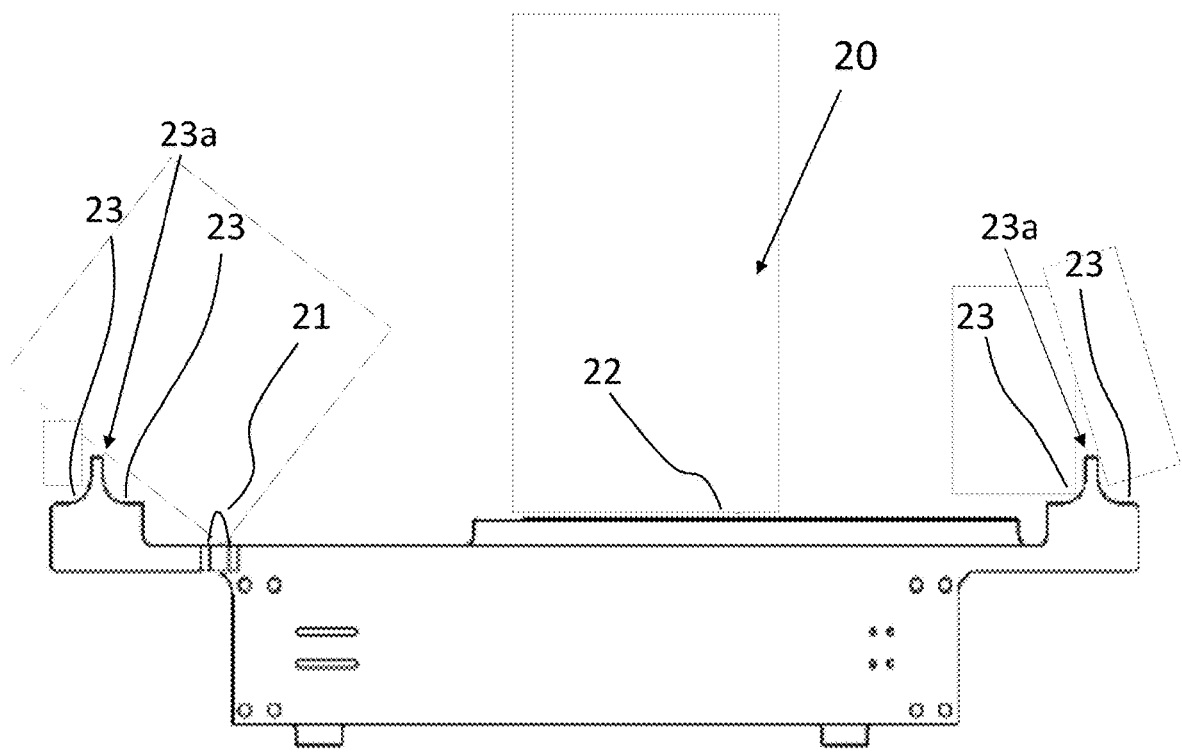
FIG. 7B illustrates a side view of the gantry arm according the exemplary embodiment of FIG. 7A.

FIGS. 7A and 7B illustrate components of a gantry arm 20 according to an exemplary embodiment of the present inventive concept. As illustrated in FIGS. 7A and 7B, each gantry arm 20 may include an alignment pin 21, a blade 22, and one or more notches 23 with a point 23a therebetween. The gantry arms 20 may further include one or more sensors 24 (see FIGS. 1 and 2) to detect the location and alignment of a UAV on the platform 10. The sensors 24 may be, for example, lasers, cameras, lidar, or any other device suitable to detect the location and orientation of a UAV on the platform 10. The sensors 24 are illustrated in FIGS. 1 and 2 as being approximately in the middle of a gantry arm 20, but it will be understood that the sensors 24 may be in any location that will allow them to detect the location and orientation of a UAV on the platform 10.

Figure 4:
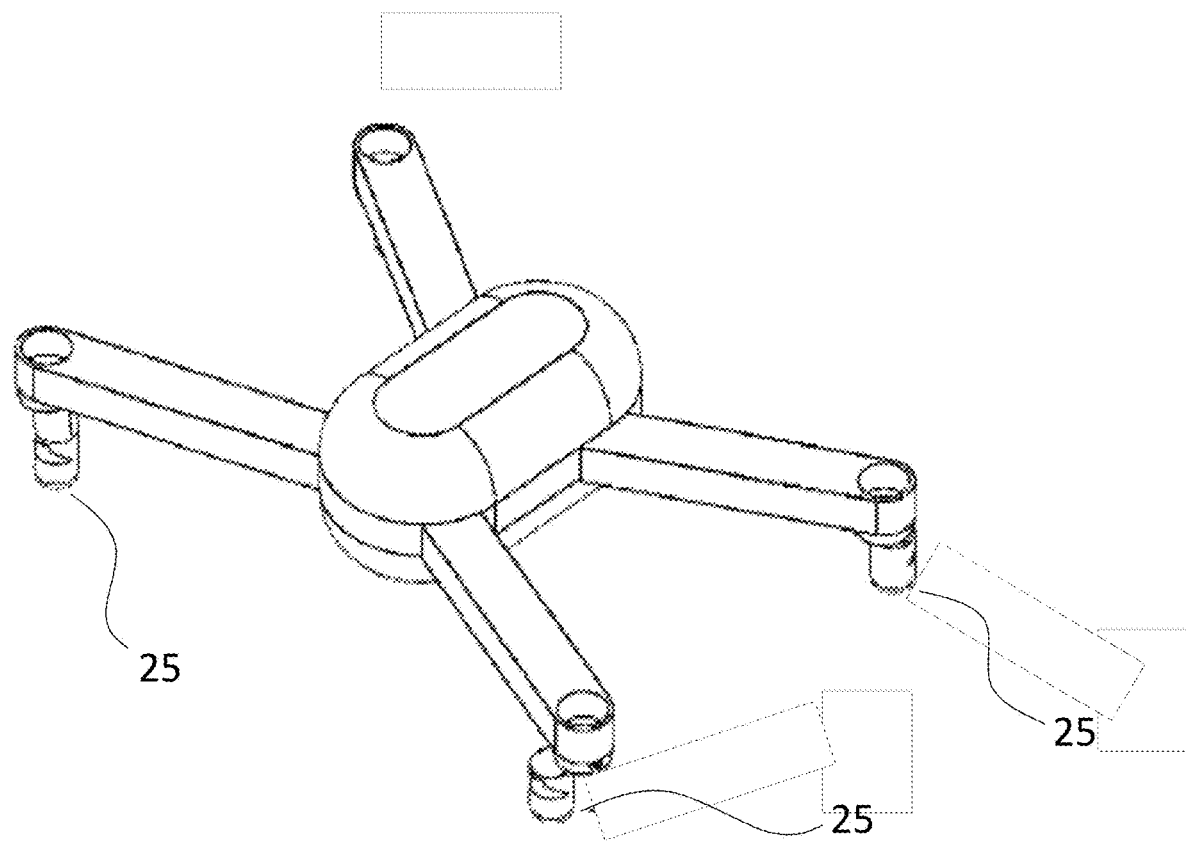
FIG. 4 illustrates feet according the an exemplary embodiment usable with the system according to FIG. 1.
Figure 5:
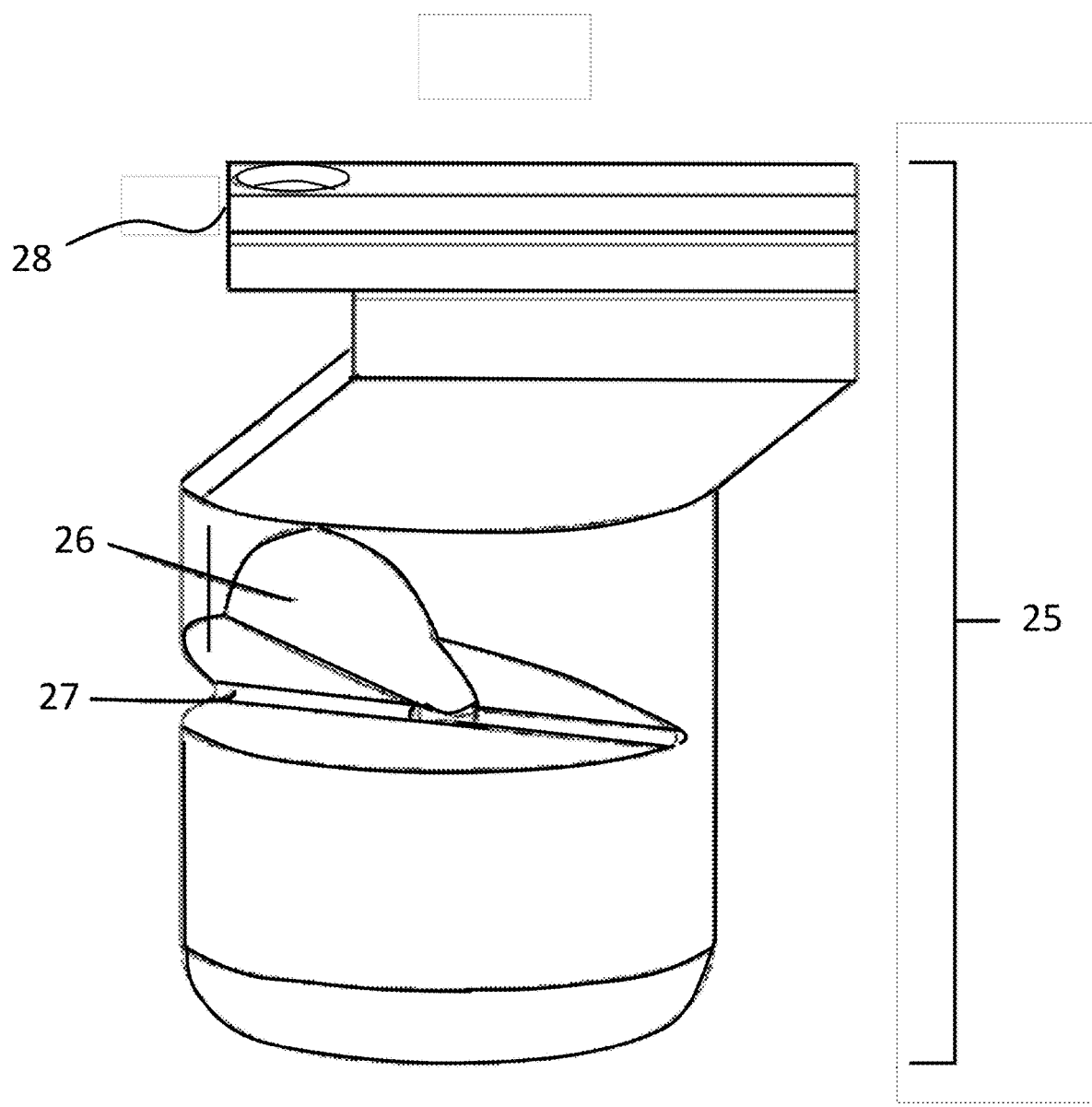
FIG. 5 illustrates a close-up side view of the feet according to the exemplary embodiment of FIG. 4.

Referring to FIGS. 4 and 5, according to an exemplary embodiment, the UAVs to be serviced by the UAV retrieval and deployment system 100 can be fitted with a plurality of specifically designed feet 25 to support the UAV on the platform 10 and to accurately engage with the gantry arms 20. In the exemplary embodiment as illustrated in FIG. 4, a UAV is fitted with four feet 25. It will be understood that more or fewer feet 25 may be fit on each UAV, according to the design of the UAV or the intended purposes of manipulation of each UAV. The feet 25 serve to hold the UAV level on the platform 10 and provide points of engagement for the gantry arms 20. Each foot 25 may include a hole 26 and a slot 27, which may overlap with each other. This arrangement of the hole 26 and slot 27 is illustrated in FIG. 5, depicting an individual foot 25 according to an exemplary embodiment. The hole 26 may be configured to engage with the alignment pin 21, and the slot 27 may be configured to engage with the blade 22 (see FIGS. 7A and 7B). The overall shape of each foot 25 can be made to engage with the notches 23 on the gantry arms 20 (see FIGS. 7A and 7B). In the exemplary embodiment illustrated in FIG. 4, each foot 25 has a cylindrical shape, to engage with the rounded notches 23 illustrated in FIGS. 7A and 7B, such that the gantry arm 20 may manipulate the UAV per the process described in detail below.

Referring to FIG. 5, each foot 25 can connected to a leg of the corresponding UAV by an interface point 28 that is configured to be capable of attaching to a specific size leg of a UAV. The foot 25 may be connected to a corresponding leg of the UAV at the interface point 28 by, e.g., an adhesive, screws, or the like. Aside from this interface point 28, each foot 25 to be used with the system 100 can have a predetermined shape and design regardless of the UAV, since each foot 25 will engage with the same gantry arms 20. This construction of the feet 25 allows for platform cooperation with any size, shape and type of UAV, i.e., the system 100 may service any UAV which has the feet 25 mounted thereto, regardless of details such as the UAV manufacturer, the UAV operating system, etc.

Figure 6A:
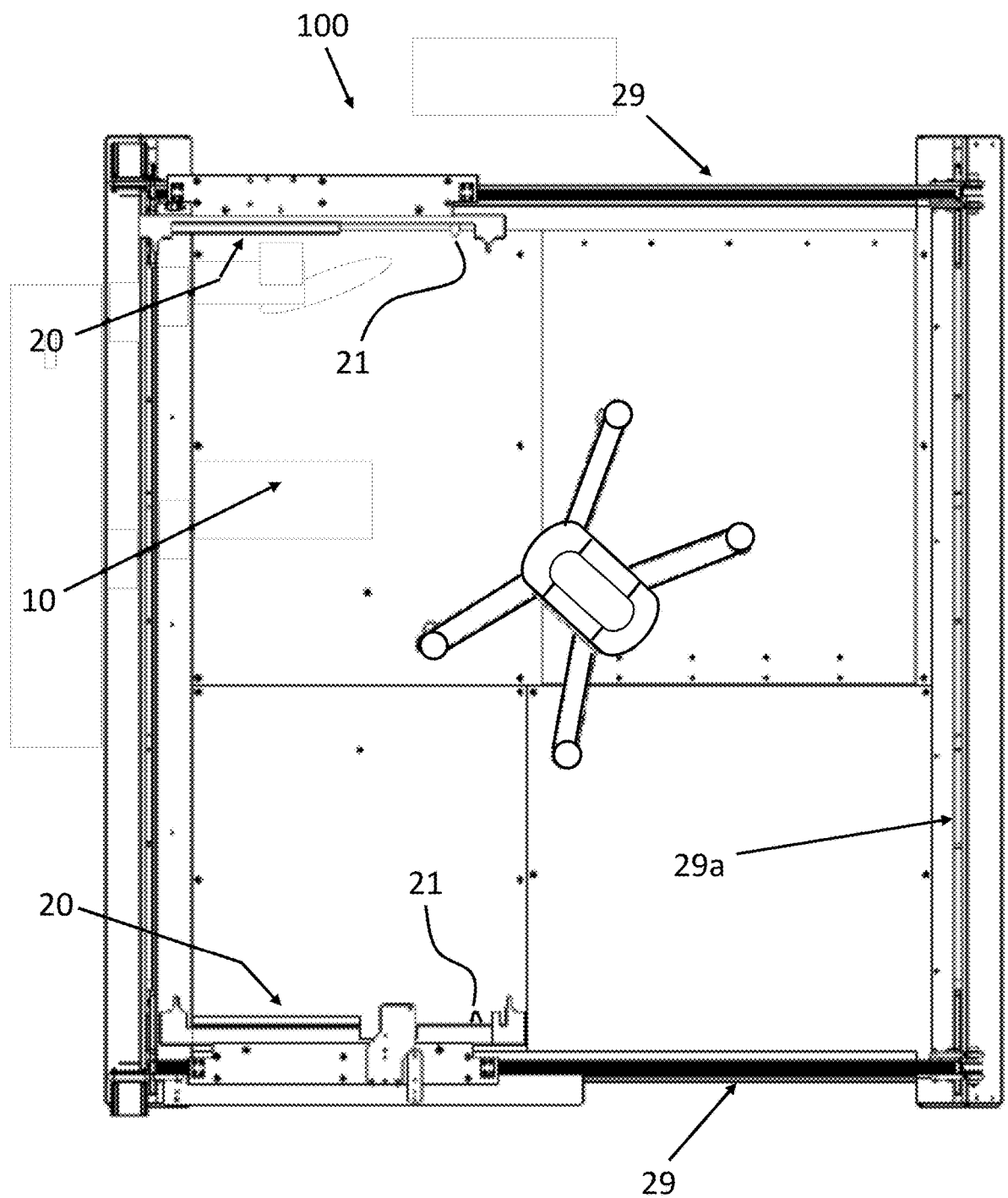
FIG. 6A illustrates another top view of the exemplary embodiment of FIG. 1 in operation.

In operation, the gantry arms 20 may manipulate a UAV on the platform 10. As illustrated in FIG. 6A, a UAV which has landed on the platform 10 most likely will not be perfectly aligned to fit through the opening 13 of the system 100 or to be stored properly in the storage area 30. Accordingly, the gantry arms 20 may detect the position and orientation of the UAV via the sensors 24. In an exemplary embodiment, after a UAV has landed on the platform 10 of the system 100, one or more of the gantry arms 20 may move fluidly to any position along their respective tracks 29, using the sensors 24 that can take several "snapshots" or any other form of an image of the UAV to determine its position and orientation on the platform 10.

After determining the position and orientation of a UAV, the gantry arms 20 may then move to engage with the UAV according to the detected position and orientation. In an exemplary embodiment as illustrated in FIG. 6B, the tracks 29 may be moved over the platform 10 to any position in order to bring the gantry arms 20 towards the UAV.

The gantry arms 20 may change the orientation of the UAV via the notches 23. In the exemplary embodiment illustrated in FIGS. 7A and 7B, the notches 23 are provided in pairs, one on each end of the gantry arms 20, such that the gantry arms 20 may be moved to engage with the feet 25 from a variety of angles. By pushing the feet 25 from opposite sides of the UAV (illustrated in FIG. 6B) via the notches 23, the gantry arms 20 may rotate the UAV in place on the platform 10 to achieve a preferred orientation. In an exemplary embodiment, the feet 25 on the UAV are cylindrical in shape in order to better enable the rotation of a UAV through interaction with the gantry arms 20.

In an exemplary embodiment, the gantry arms 20 may also determine if a UAV has landed on one of the arms 20 themselves. When such a determination is made, a free gantry arm 20 (i.e., a gantry arm 20 that the UAV has not landed on) may be moved to engage the notches 23 with the feet 25 to rotate the UAV, such that the UAV rotates off the gantry arm 20 it has landed on, and is moved freely onto the platform 10. Alternatively, a gantry arm 20 that the UAV has landed on may be moved quickly to move out from under the UAV, akin to pulling a tablecloth out from under dishes.

Figure 8A:
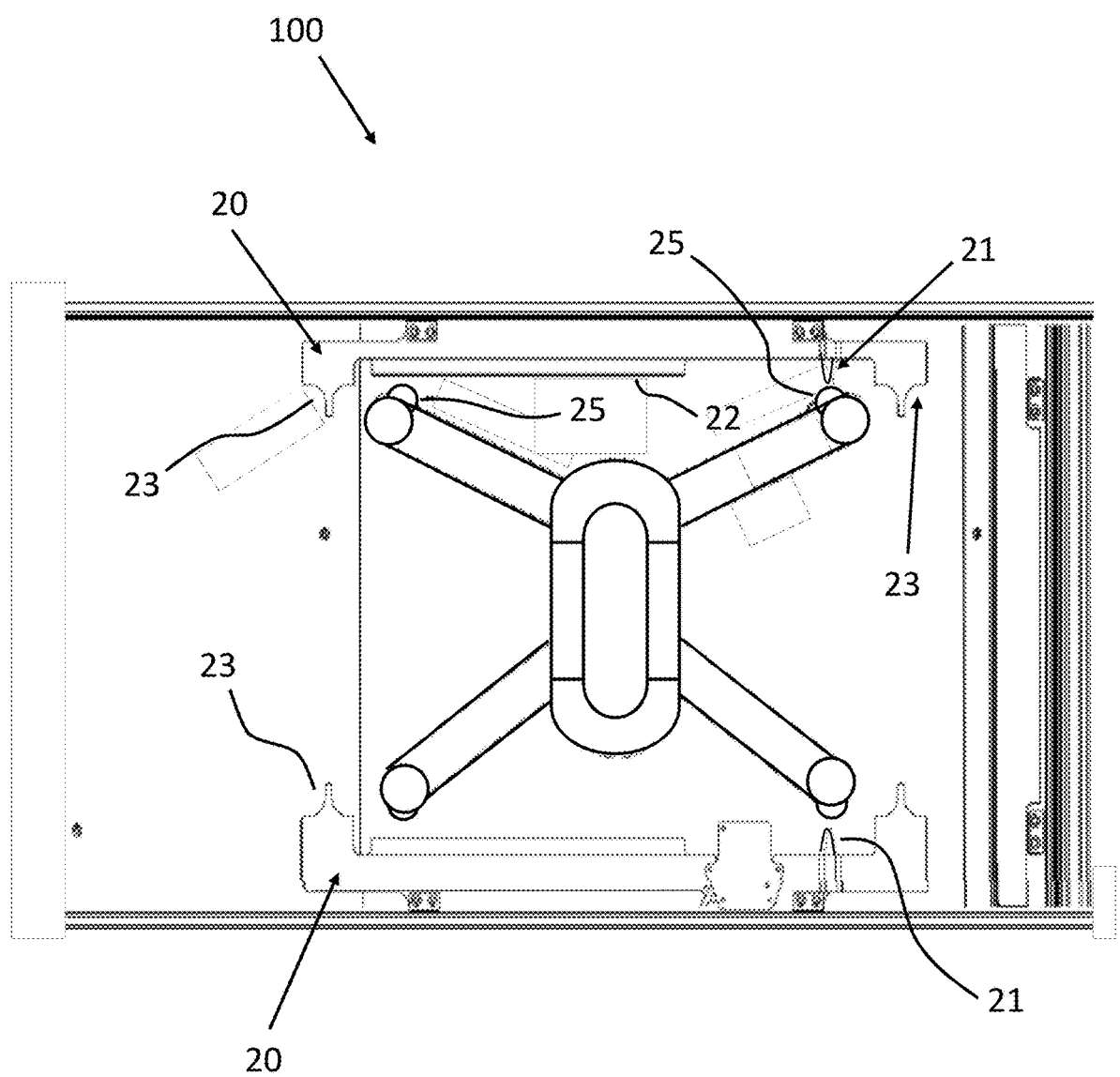
FIG. 8A illustrates yet another top view of the exemplary embodiment of FIG. 1 in operation.
Figure 8B:
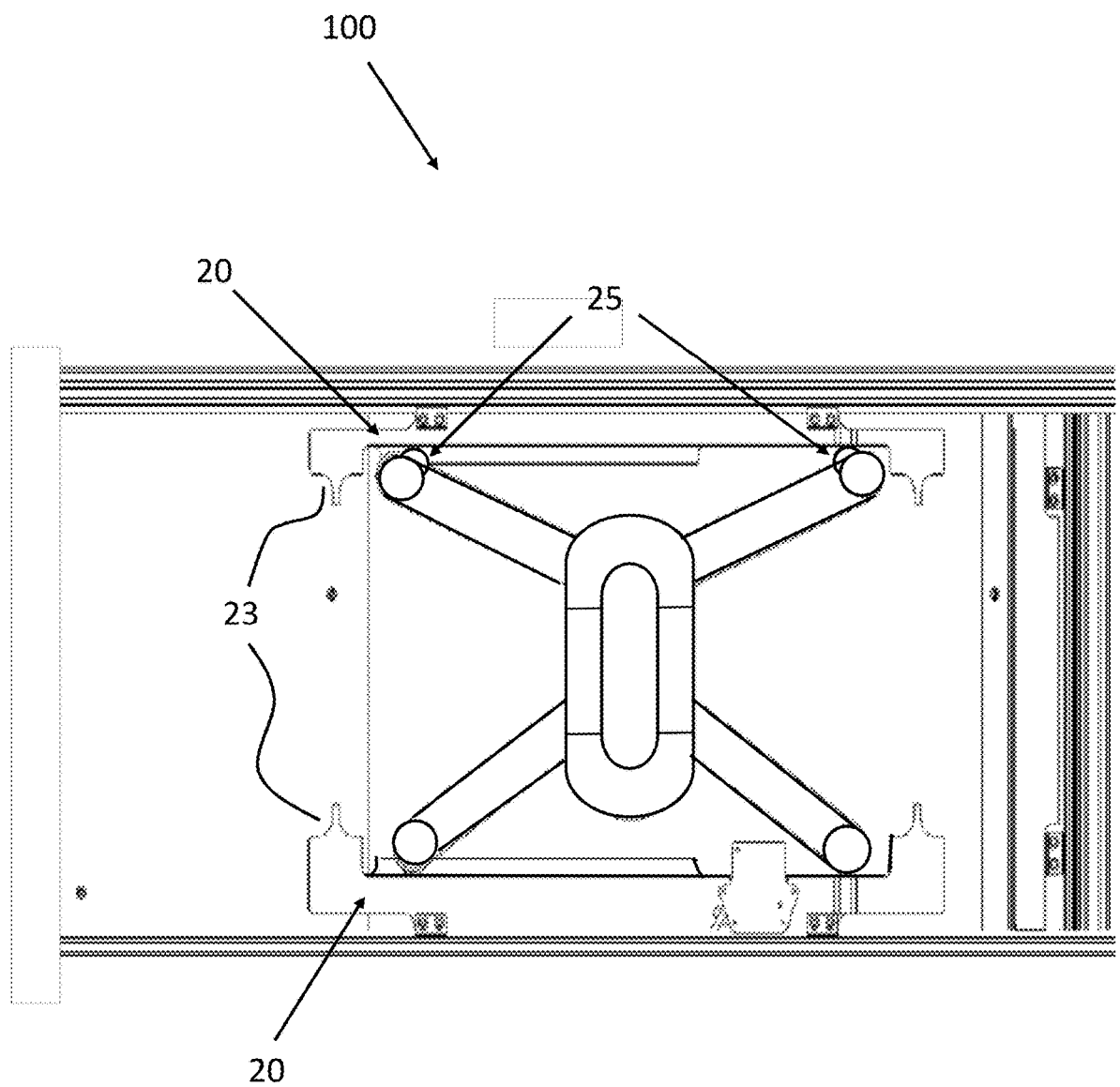
FIG. 8B illustrates yet another top view of the exemplary embodiment of FIG. 1 in operation.

The preferred orientation of the UAV generally includes a pair of feet 25 lined up with each gantry arm 20. Once the UAV is in this orientation, the gantry arms 20 may close in on the UAV, such that the alignment pin 21 on each gantry arm 20 can be inserted into a respective hole 26 of a corresponding foot 25, and the blade 22 on each gantry arm 20 can become inserted into the slot 27 of a different foot 25. This engagement process is illustrated in FIGS. 8A-B, respectively illustrating the gantry arms 20 prior to engagement of the feet 25 of the UAV (FIG. 8A) and the gantry arms 20 after engagement with the feet 25 of an oriented UAV (FIG. 8B).

The alignment pin 21 and blade 22 of the gantry arms 20 enables the gantry arms 20 to engage with a variety of different UAVs. Specifically, for each gantry arm 20 the alignment pin 21 may engage with one foot 25, and the blade 22 may engage with another foot 25. As illustrated, for example, in FIGS. 8A and 8B, the blade 22 may extend over a preset distance that is longer than the width of a UAV foot 25. This construction allows each gantry arm 20 to engage with feet 25 that are spaced apart by a variety of distances. In other words, the gantry arms 20 may engage with UAVs of various sizes, without the gantry arms 20 themselves needing to be reconfigured to engage with each specific UAV.

The alignment pins 21 and blades 22 according to the exemplary embodiment of FIGS. 7A and 7B may engage with the feet 25 and thereby positively lock the UAV in place on the gantry arms 20. Once the UAV is locked in place, the gantry arms 20 can be moved to carry the UAV to any desired location on the platform 10, for example over the door 12. Furthermore, the hole 26 and slot 27 of each foot 25 in accordance with the exemplary embodiment of FIGS. 7A and 7B are preferably positioned such that when the alignment pin 21 and blade 22 engage with the feet 25, the feet 25 become raised slightly off the platform 10. This can be accomplished by tapering the hole 26 and slot 27, as illustrated, for example in FIG. 5. The alignment pin 21 and blade 22 of the gantry arms 20 may begin to engage with the hole 26 and slot 27, and the tapered shape of the hole 26 and slot 27 will lift the UAV off the platform 10 when the pin 21 and blade 22 are fully inserted. Raising the feet 25 in this manner minimizes friction of the feet 25 against the platform 10 while the UAV is moved. After the gantry arms 20 release the UAV, the gantry arms 20 may move back to the home position at the edges of the platform 10, such that the platform 10 is clear to receive another UAV.

A similar process may be used to retrieve UAVs to be deployed from the system 100. When a UAV is moved up through the opening 13 to the platform 10, the gantry arms 20 may move and engage with the feet 25 of the UAV through a similar process. Notably, gantry arms 20 will not need to manipulate the orientation of the UAV in this situation, since the UAV is generally raised from the storage area 30 to the platform 10 of the system 100 already in the ideal orientation to be locked to the gantry arms 20. Once locked to the UAV, the gantry arms 20 may move the UAV away from the opening 13, allowing the door 12 to close, while the gantry arms 20 can place the UAV on any desired location of the platform 10. This can occur as a result of using precision motors to operate movement of the gantry arms, 20, such as, for example, stepper motors or any other precision motors that will performed the intended purposes of controlling placement and reception of UAVs as described herein. The gantry arms 20 may then move away from the UAV, disengaging from the UAV and returning to the home position, so that the platform 10 is cleared and the UAV may be deployed.

The gantry arms 20 may also be used to clear the platform 10. For example, if the sensors 24 of the gantry arms 20 detect a foreign object on the platform 10, for example, debris, snow, or when a UAV is not configured to be engaged by the gantry arms 20, the gantry arms 20 may move to sweep off the platform 10. In an exemplary embodiment as illustrated in FIG. 2, the platform 10 may include a chute 15 at one or more sides, such that the gantry arms 20 may sweep debris off the platform 10 to the chute 15 to be removed from the platform 10 and clear the way for other UAVs. The chute 15 is illustrated in FIG. 2 with dashed lines to indicate a possible location and orientation for the chute 15. It will be understood that the chute 15 may have any shape or location suitable for the specific application of the system 100.

Figure 7C:
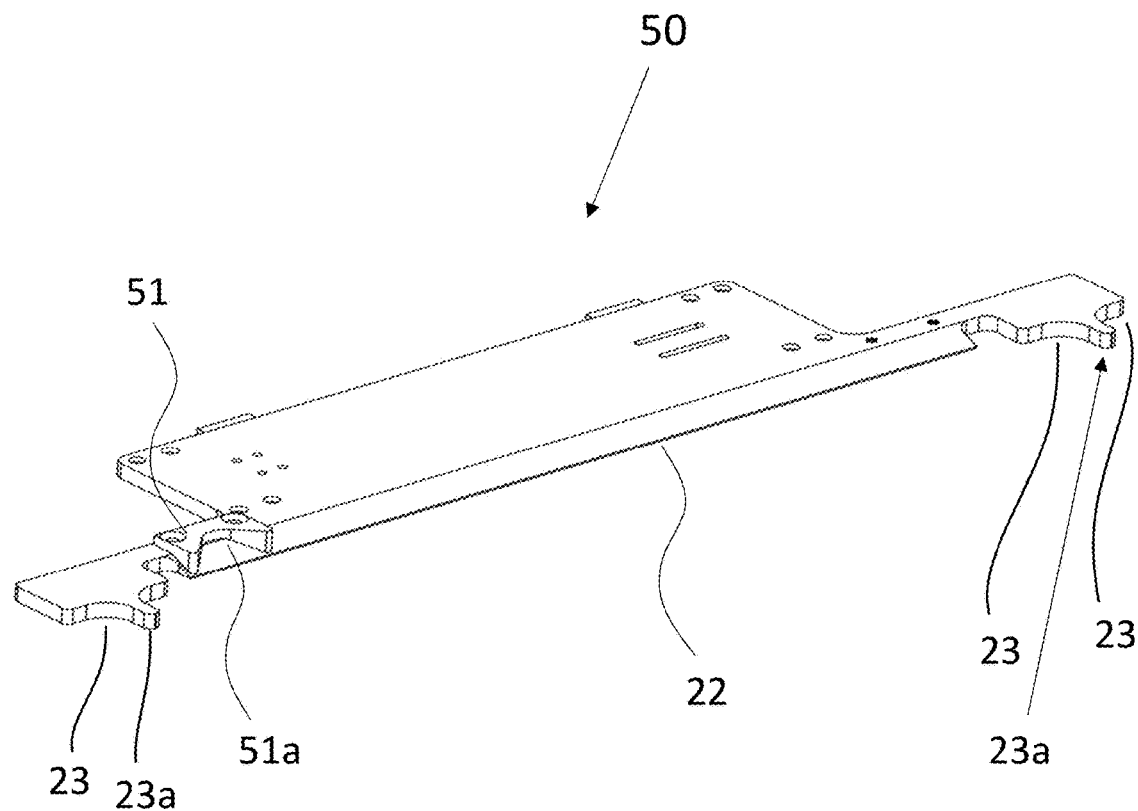
FIG. 7C illustrates a perspective view of a gantry arm in accordance with another exemplary embodiment of the present inventive concept.
Figure 7D:
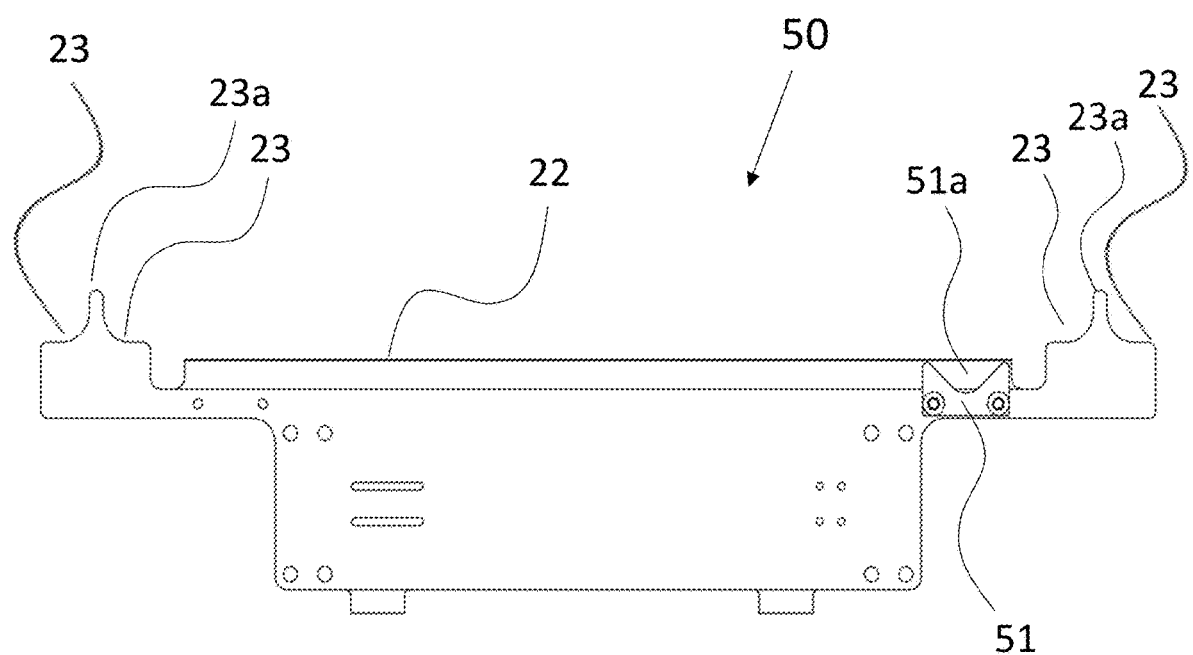
FIG. 7D illustrates a side view of the gantry arm according the exemplary embodiment of FIG. 7C.

FIGS. 7C and 7D illustrate a gantry arm 50 in accordance with another exemplary embodiment of the present inventive concept. The gantry arm 50 in accordance with the exemplary embodiment of FIGS. 7A and 7B are very similar to the gantry arm 20 illustrated in the exemplary embodiment of FIGS. 7A and 7B, however, the gantry arm 50 does not include the alignment pin 21 to engage with the hole 26 and slot 27 of the feet 25, as illustrated in FIG. 5. Instead, the gantry arm 50 includes can include a wedge 51 with an internal portion 51a that receives the outside of the feet 25 such that the feet 25 become engaged within an internal portion 51a of the wedge 51. The wedge 51 is designed to receive the feet 25 such that the internal portion 51a of the wedge 51 will be slightly larger in both height and width than the height and width of the feet 25. With this design of the wedge 51, the feet 25 will be securely received within the internal portion 51a of the wedge 51 without additional room for the respective foot 25 to move around, thus providing an engagement between each foot 25 and the internal portion 51a of the wedge 51 such that precise placement of the UAV can be accomplished with a pair of gantry arms 50 disposed on corresponding tracks 29, similar to the arrangement illustrated in the exemplary embodiments of FIGS. 2, 3, 6A and 6B. As a result of the specific design of the wedge 51, precise positioning of the UAV at any desired location on the platform 10 can be achieved.

Figure 9A:
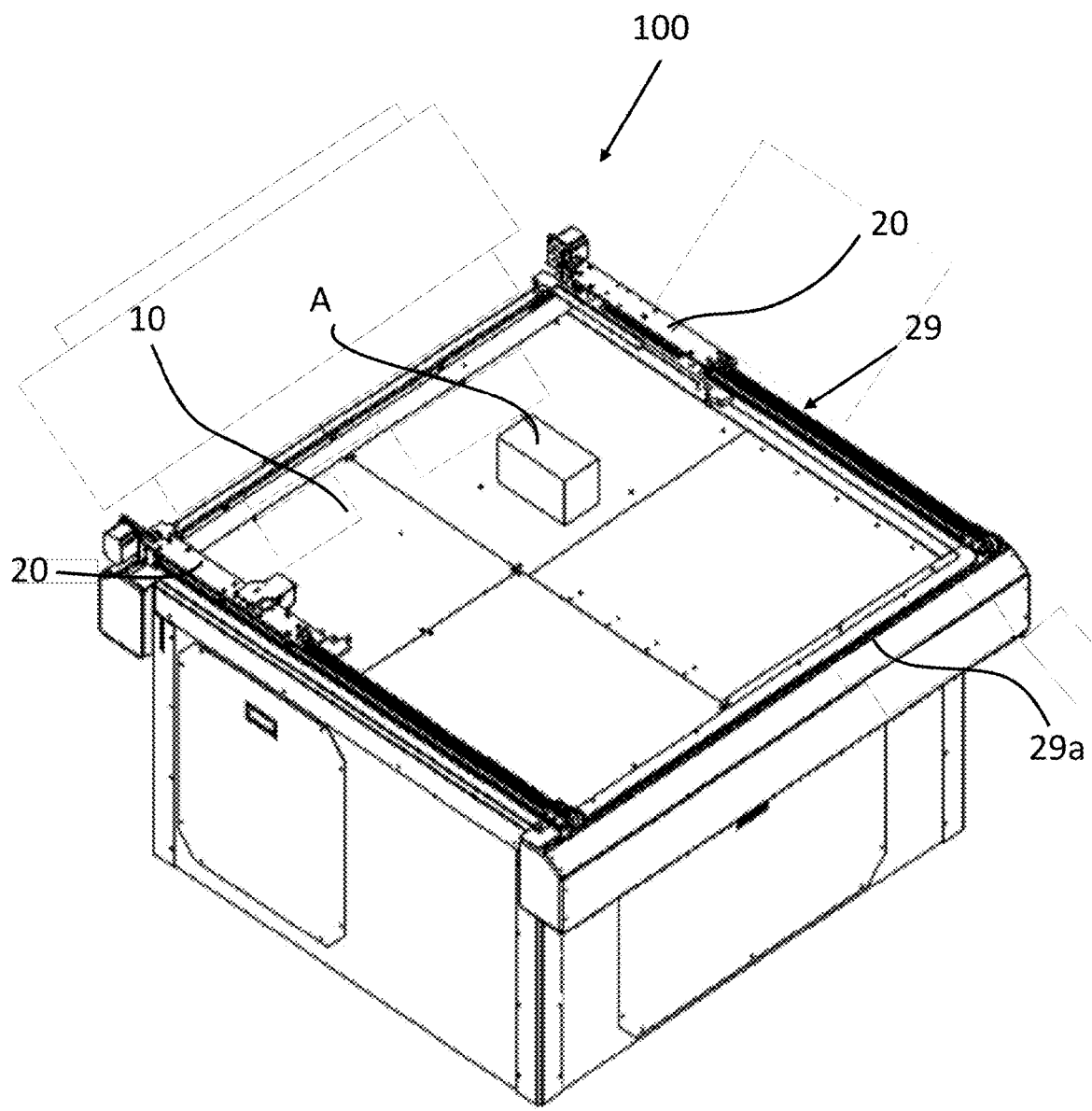
FIG. 9A illustrates a perspective view of the exemplary embodiment of FIG. 1 in operation.
Figure 9B:
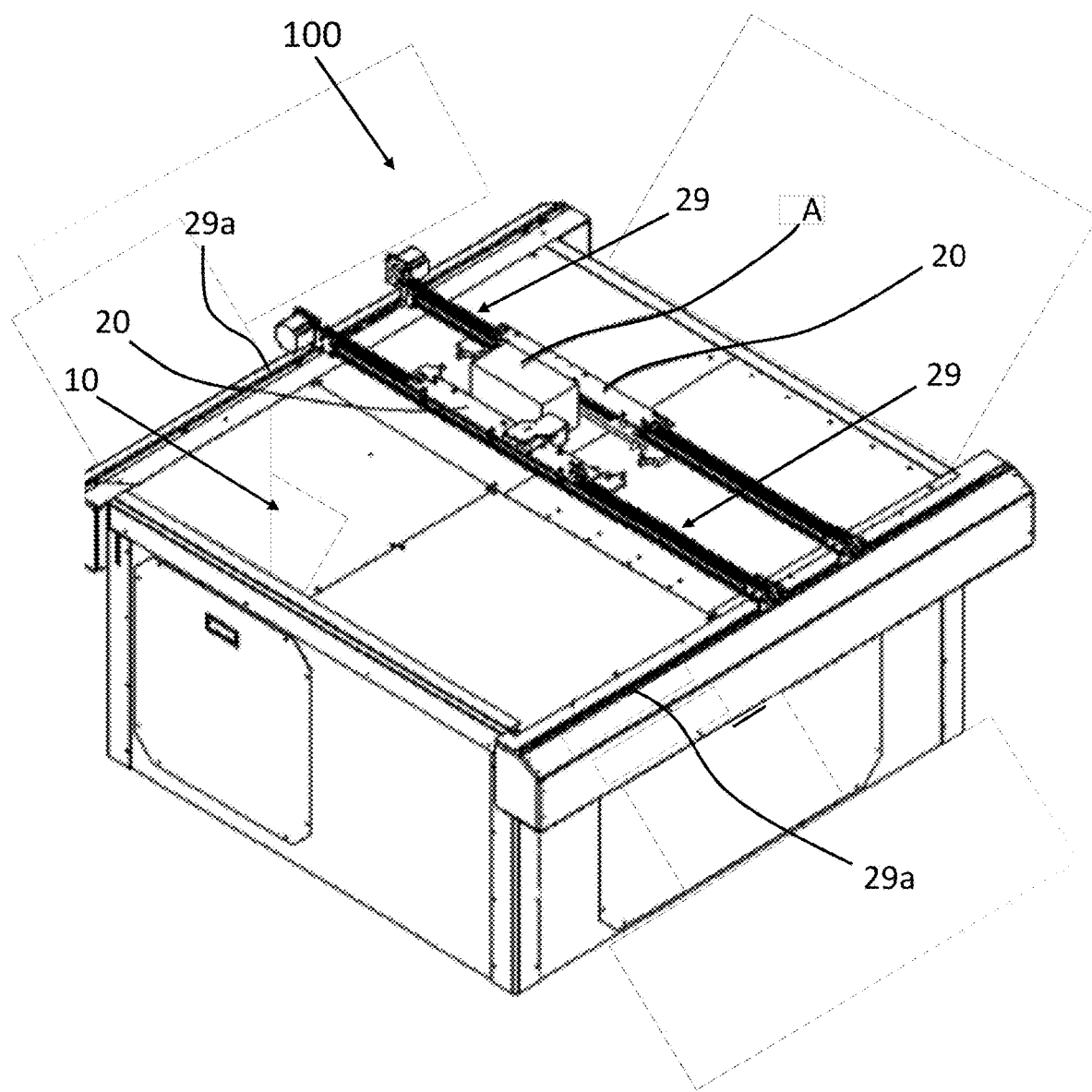
FIG. 9B illustrates another perspective view of the exemplary embodiment of FIG. 1 in operation.
Figure 9C:
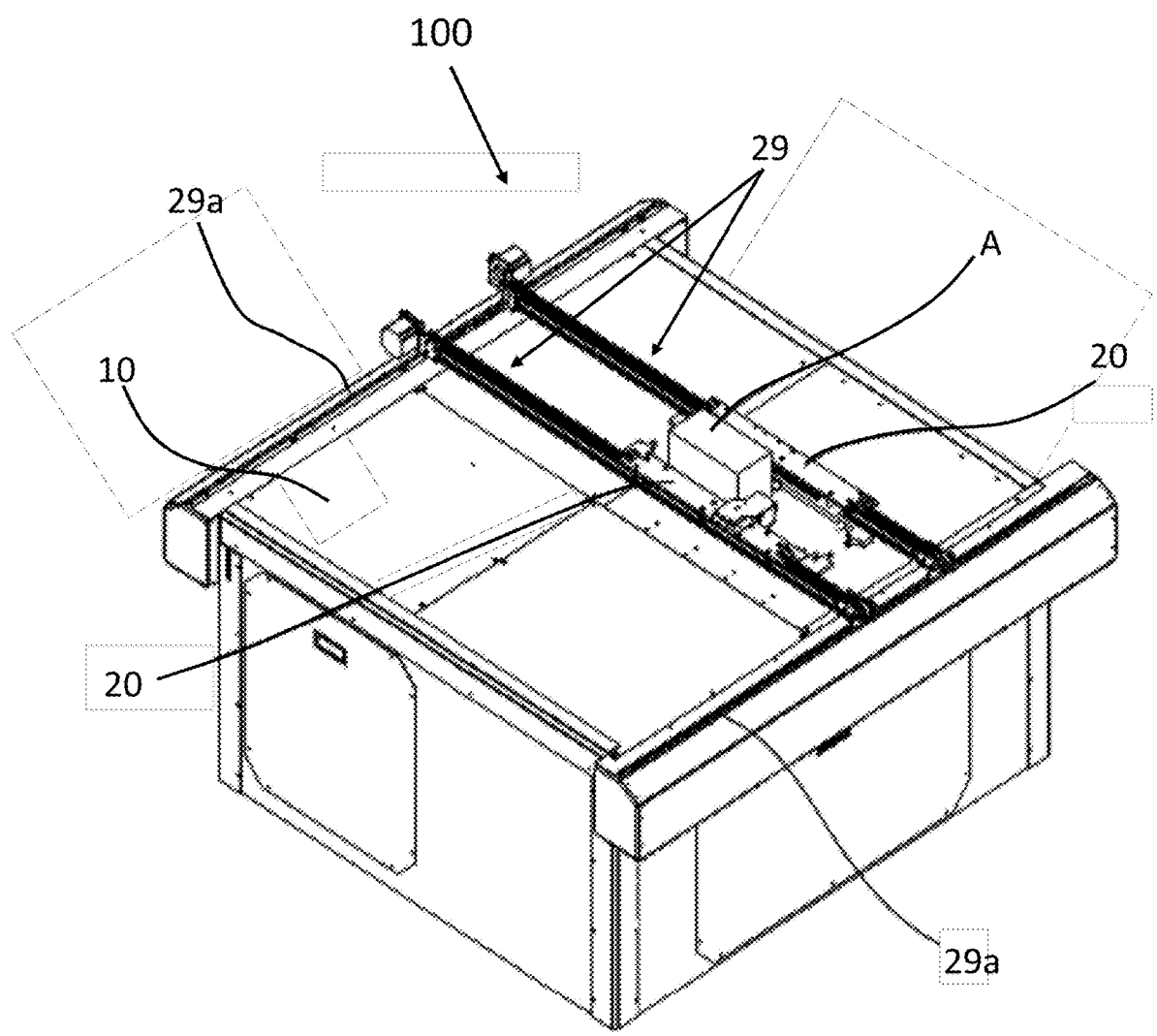
FIG. 9C illustrates still another perspective view of the exemplary embodiment of FIG. 1 in operation.
Figure 9D:
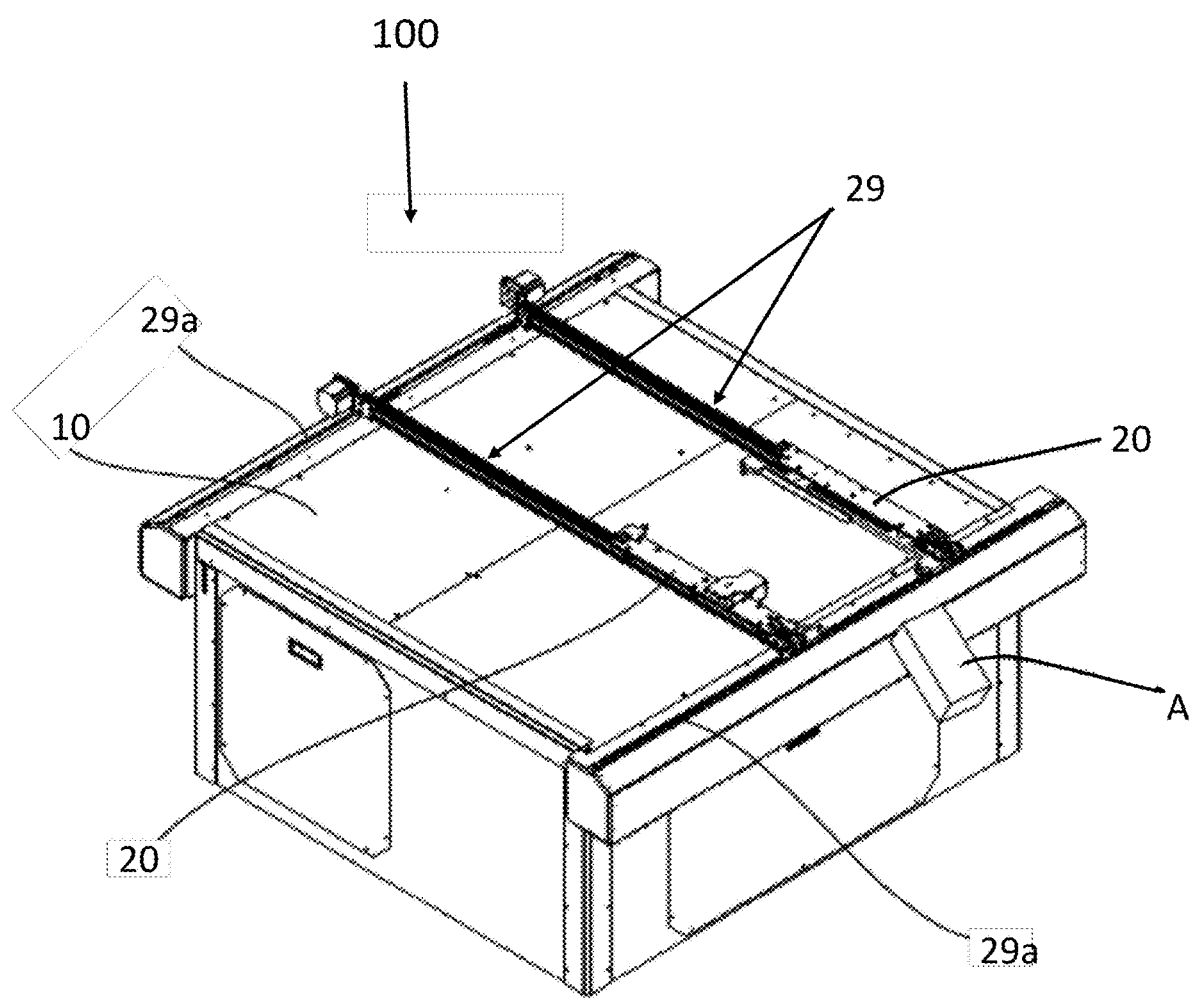
FIG. 9D illustrates yet another perspective view of the system according to the exemplary embodiment of FIG. 1 in operation.

FIGS. 9A through 9D and 10A through 10C illustrate exemplary embodiments of a method of removing a foreign object from the platform 10 of system 100. In the exemplary embodiment as illustrated in FIGS. 9A through 9D, a foreign object A is located on the platform 10 between the gantry arms 20 (FIG. 9A). The gantry arms 20,50 can move towards the foreign object A from either side to pinch the foreign object A therebetween (FIG. 9B). The gantry arms 20,50 may then be moved on their respective tracks 29 to accelerate the foreign object A towards an edge of the platform 10 (FIG. 9C). The notches 23 in the arms 20,50 may function as stops to keep the foreign object A from slipping out from between the gantry arms 20,50 as the foreign object A is accelerated. The gantry arms 20,50 may separate and pull away from the foreign object A as they reach the edge of the platform 10, such that the foreign object's (A) momentum carries it along its trajectory off the platform 10 (FIG. 9D). Optionally, this trajectory may carry the foreign object A into a chute 15, such as the chute 15 is illustrated in the exemplary embodiment of FIG. 2.

Figure 10B:
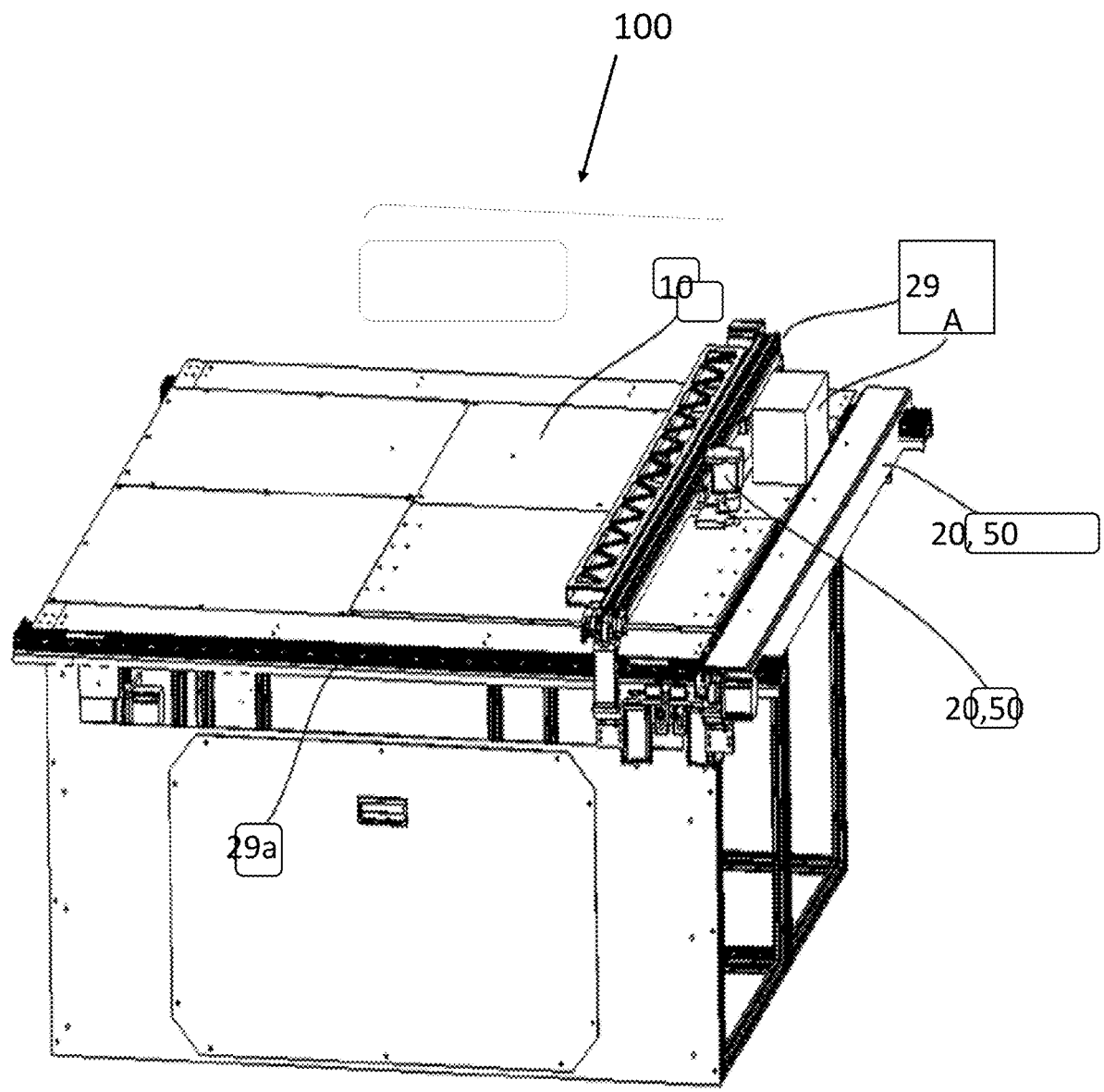
FIG. 10B illustrates yet another perspective view of the system according to the exemplary embodiment of FIG. 1 in operation.
Figure 10C:
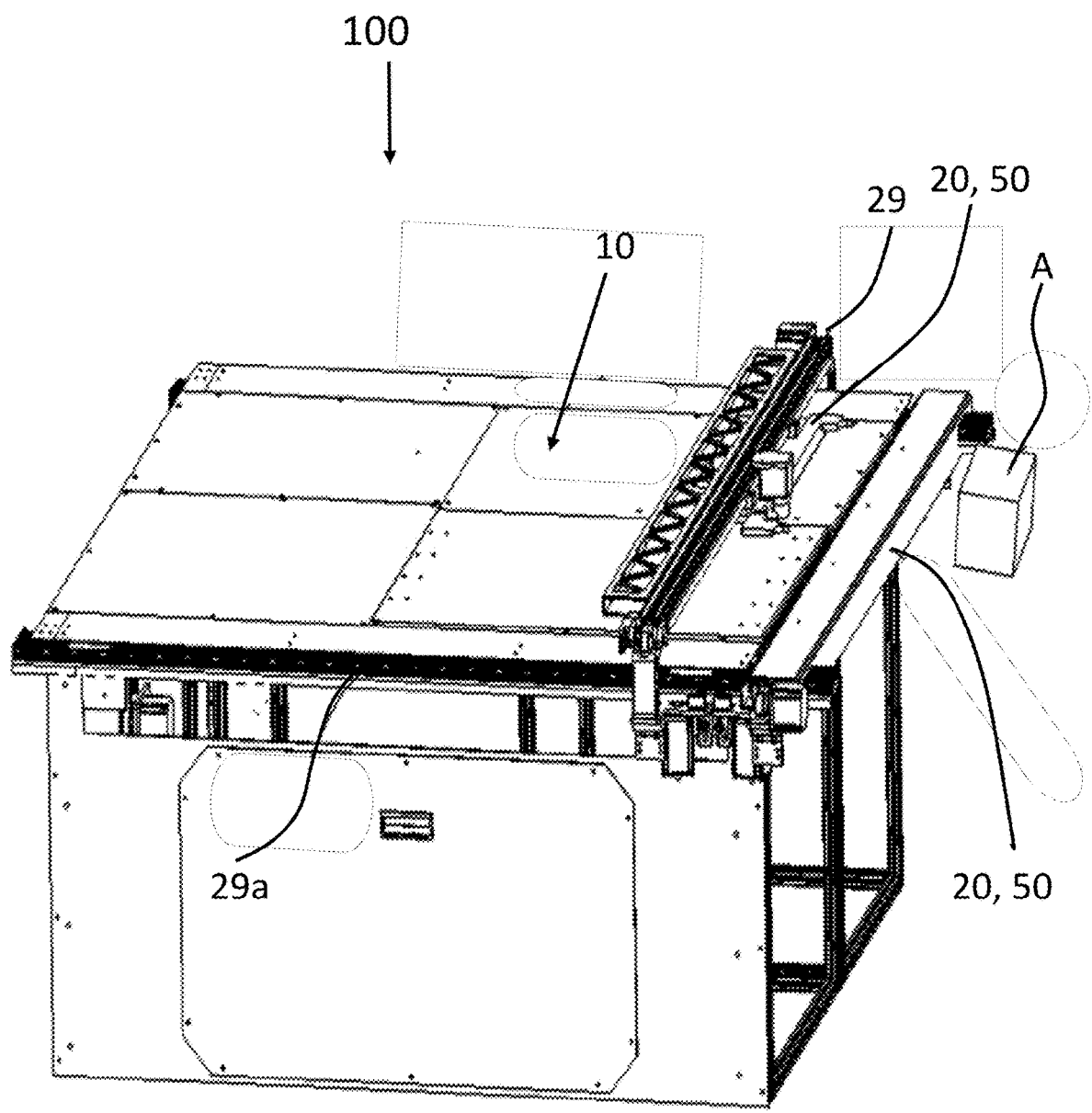
FIG. 10C illustrates yet another perspective view of the system according to the exemplary embodiment of FIG. 1 in operation.

In the exemplary embodiment illustrated in FIGS. 10A through 10C, when a foreign object A is detected on the platform 10 between the gantry arms 20,50 (similar to FIG. 9A), one of the gantry arms 20,50 and its accompanying track 29 may be moved to push the foreign object A off the platform 10 in a sweeping motion. The sweeping motion may move across the entire platform 10, accelerating the foreign object A towards the edge of the platform 10 (FIGS. 10A and 10B). As illustrated in FIG. 10C, the sweeping gantry arm 20 and track 29 may accelerate to a predetermined location (e.g., the limit of the arm 20 and track 29's movement along the length of the rail 29a) and then stop, allowing the momentum of the foreign object A to accelerate the foreign object A off the platform 10, similarly to the embodiment illustrated in FIGS. 9A-9D. Optionally, the foreign object A may be moved by the sweeping motion such that it is directed into a chute 15 such as the chute 15 illustrated in FIG. 2). In this exemplary embodiment, if there is another gantry arm 20 in the path of the sweeping motion to move the foreign object A, that gantry arm 20 and corresponding track 29 may be moved out of the way, for example by moving to the edge of the platform 10 and flipping downward with respect to the platform 10.

FIGS. 10A through 10C illustrate an exemplary embodiment in which one gantry arm 20,50 and corresponding track 29 has been flipped sideways to be substantially level with the platform 10, thereby clearing the way for the foreign object A to be swept off the platform A.

Figure 11:
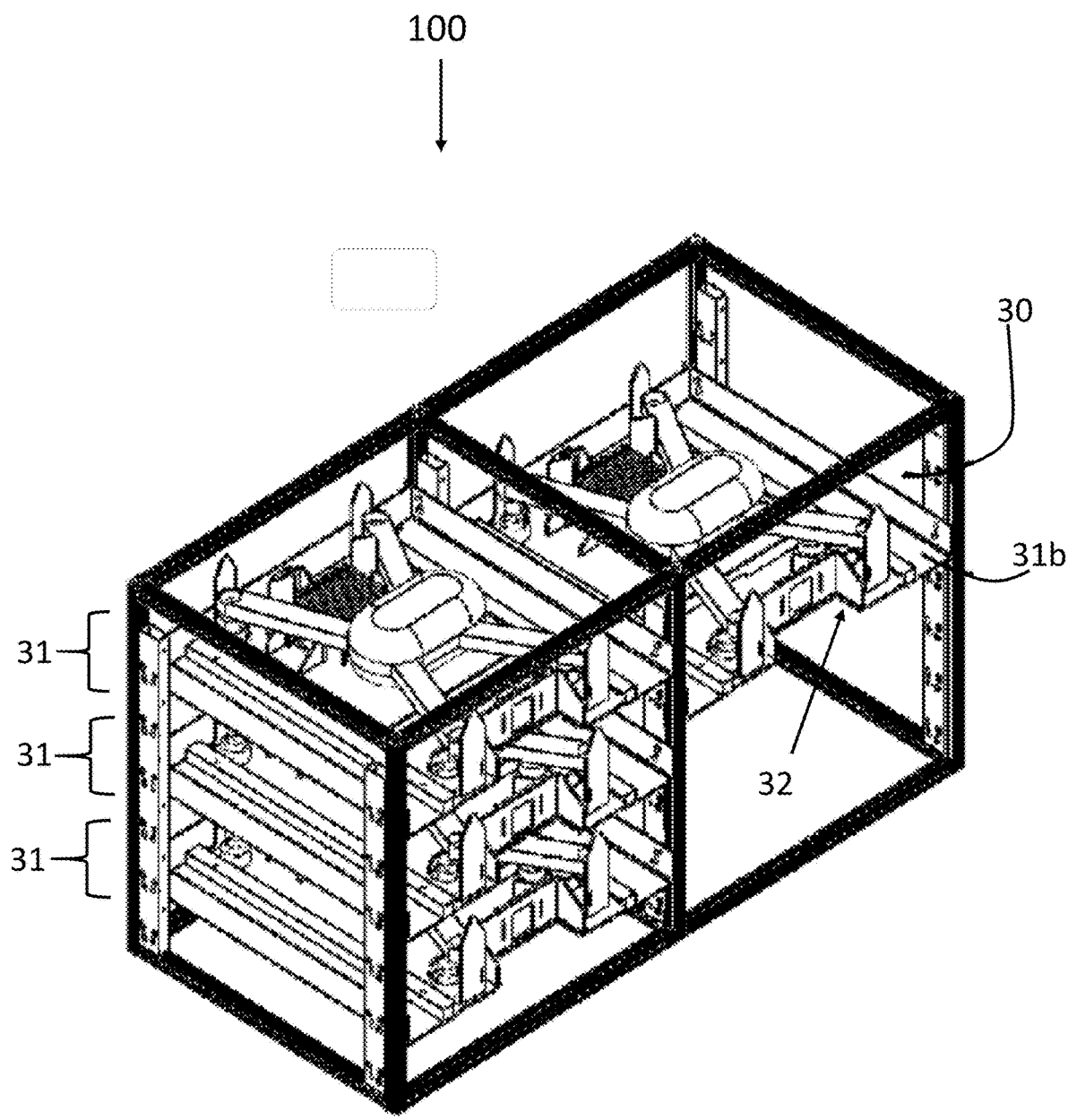
FIG. 11 illustrates an internal view of the system according to the exemplary embodiment of FIG. 1.
Figure 12C:
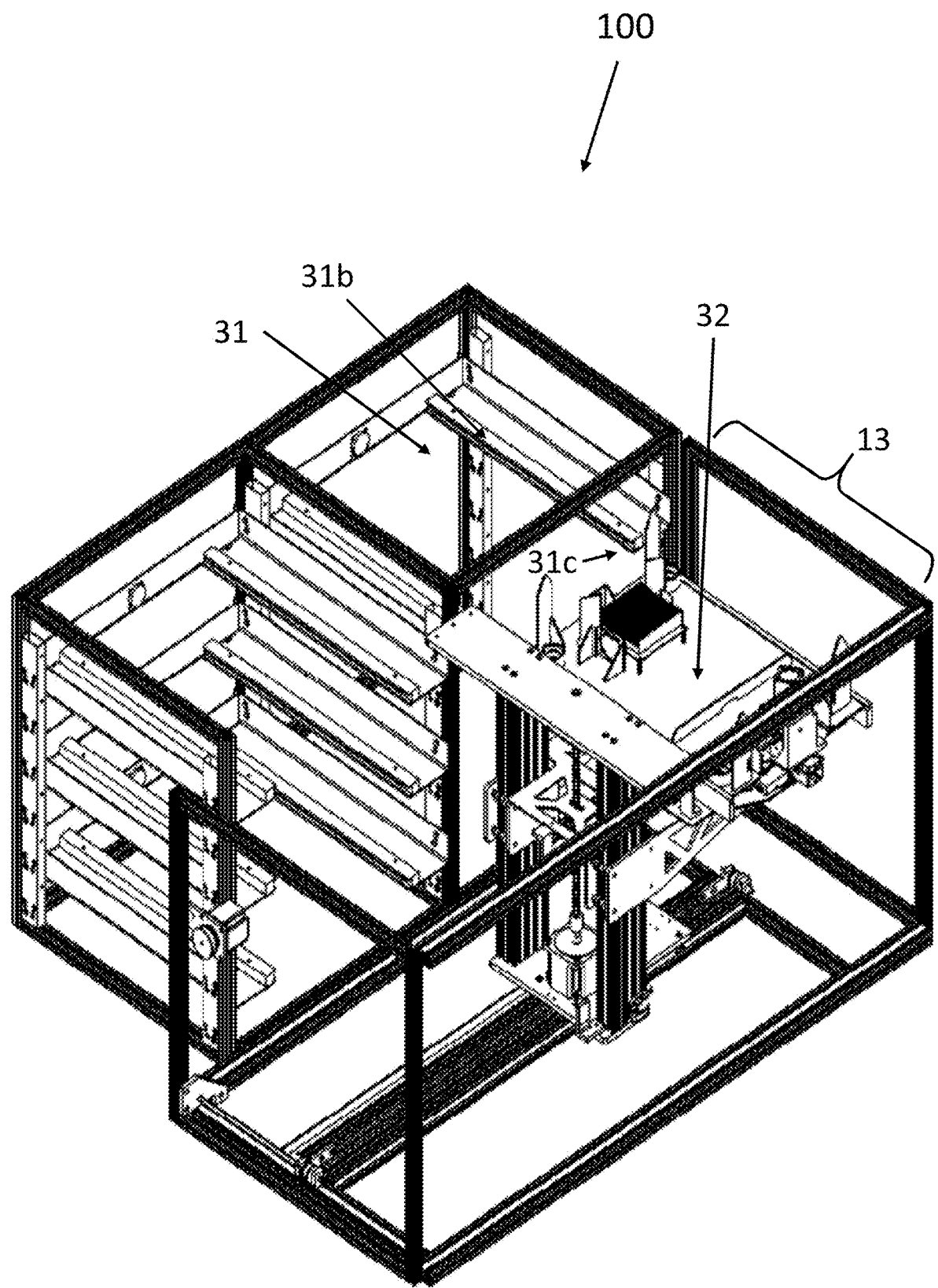
FIG. 12C illustrates still another internal view of the system according to the exemplary embodiment of FIG. 12A.

FIGS. 11 and 12A through 12D illustrate a storage area 30 according to an exemplary embodiment of the present inventive concept. The storage area 30 in FIG. 11 may include one or more cells 31, each cell 31 including a corresponding tray 32. Each cell 31 may store a single UAV on the corresponding tray 32. As such, more cells 31 equate to more UAVs being stored in storage area 30. As illustrated in FIG. 12A, the storage area 30 may further include a manipulator 33, for example an arm and/or a set of rails, to deliver the UAVs to their respective cells 31 after retrieval. The manipulator 33 can also retrieve the UAVs from their respective cells 31 and move the retrieved UAV below the door 12 or opening 13 prior to deployment. The cells 31 are preferably arranged in a grid formation as illustrated in FIG. 11, to allow the manipulator 33 to move efficiently to a selected cell 31.

FIGS. 12A-12D illustrate a tray 32 among a plurality of trays (in this example vertically stacked) according to an exemplary embodiment of the present inventive concept. The trays 32 may each be a uniform size, to enable easier storage in the cells 31. Furthermore, each tray 32 may be constructed to hold a specific UAV. More specifically, each tray 32 may include slots 35 specific to the positioning of the feet 25 on the corresponding UAV. That is, the slots 35 may be arranged on the tray 32 in the same pattern as the feet 25, such that each foot 25 fits into a corresponding slot 35 when the UAV is aligned with and attached to the tray 32. Each tray 32 may further include one or more sockets 36 to interface with the UAV and provide power and/or data to the UAV. The socket(s) 36 may be any configuration suitable to transfer data and/or power, including, for example, male/female connectors for hardline connections, or a pair of coils for inductive (wireless) charging. The tray 32 may also include a power supply 37 specific to the UAV, for example a power adapter to convert input power (e.g., 120 volts alternating current from a United States standard wall socket) to the specific power requirements of the UAV. Each tray 32 therefore functions as an adapter to charge the UAV and also to allow a controller 40 (described in detail below) to interface with and communicate with the UAV. The socket(s) 36 are preferably self-aligning, i.e., configured such that the UAV may be connected to the socket(s) 36 by being engaged with the tray 32, and similarly the UAV may be disconnected from the socket 36 by disengaging the UAV from the tray 32, as described above. That is, the socket(s) 36 do not need to be separately connected to the UAV after it is engaged with the tray 32, nor do they need to be separately disconnected from the UAV prior to disengaging the UAV from the tray 32.

Each tray 32 may further include a plurality of supports 38 to lock the propellers of the UAV in place during storage. In an exemplary embodiment, these supports 38 are specific to the UAV to be held on the tray 32. The supports 38 may be shaped and positioned to correspond with propellers on the UAV, such that the propellers are moved into a storage position and held firmly in place by the supports 38. This ensures that the propellers are kept from rotating and are held in an optimum position to not interfere with the operation of any of the components of the system 100, for example the door 12 or the manipulator 33.

Figure 12D:
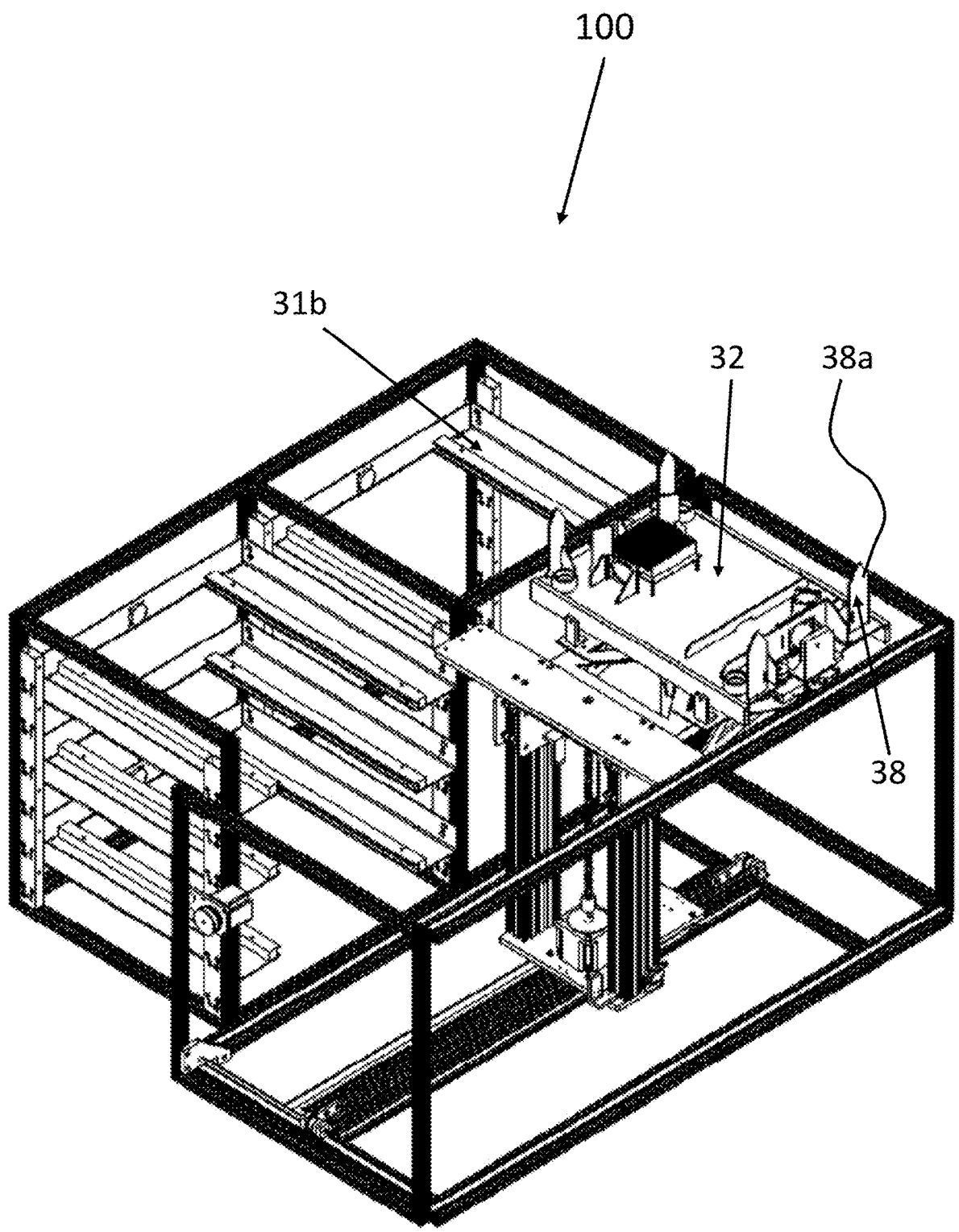
FIG. 12D illustrates yet another internal view of the system according to the exemplary embodiment of FIG. 12A.

In an exemplary embodiment illustrated in FIG. 12D, the supports 38 may be thin slats with pointed ends 38a. The angled surfaces of the UAV's propellers may deflect off of the end 38a of the supports 38 as the UAV is engaged with (e.g., lowered onto) the tray 32. This deflection may rotate the propellers until they hit the sides of the supports 38 and are held in place thereby.

Referring back to FIG. 12A, each tray 32 may further include an engagement point 39 to interface with the manipulator 33. The engagement point 39 may be, for example, a mechanical device such as, for example, a socket or handle. Alternatively, the engagement point 39 may be a magnet or other non-mechanical device to allow the manipulator 33 to engage with the tray 32 and move the tray 32 into a desired position.

Once the cell(s) 31 are placed in the storage area 30, the cells 31 are preferably static and do not move relative to the rest of the system 100. Each cell 31 may support a tray 32. As illustrated in FIGS. 12A through 12D, each cell 31 may include mechanisms, e.g., rails 31b, to enable efficient insertion and removal of a tray 32. Each cell 31 may also include a locking mechanism 31c, which may be included in rails 31b, to hold the corresponding tray 32 in place when not in use. The locking mechanism 31c may be any device which may hold the tray 32 in place, e.g., a magnet, a clamp, or a door. This locking mechanism 31c may release the tray 32 shortly before or shortly after the manipulator 33 engages with the tray 32, to thereby enable the tray 32 to be removed from the cell 31. Similarly, the locking mechanism 31c may engage with a tray 32 shortly before or shortly after the manipulator 33 disengages from the tray 32 after the tray 32 has been inserted into the cell 31 for storage. The locking mechanism 31c is described in more detail while referring to FIG. 13A through FIG. 13C.

Each cell 31 also preferably includes a connector point 31a for power and data, which may interface with one or more corresponding connection points 32a on the tray 32 when the tray is inserted into the cell 31. Once the tray 32 is locked in place in the cell 31 via the locking mechanism(s) 31c, power may be connected from the cell 31 to the power supply 37 of tray 32, powering the UAV through the socket(s) 36. Similarly, a hardline wired communication link for data may also be established through the sockets(s) 36 to the connection with the cell 31 (for example, via connector points 31a and connection points 32a), to enable communication between the UAV and a controller 40 (described in detail below).

Each cell 31 may be sized to hold the UAV supported by the corresponding tray 32. The cells 31 may be adjusted with respect to location in the storage area 30, and the cells 31 may also be adjusted in size. For example, if an existing UAV is replaced by a new, larger UAV, the corresponding cell 31 may be enlarged, such that only the tray 32 needs to be replaced for the system 100 to accommodate the new UAV. Alternatively, the cells 31 may be modular in construction such that individual cells 31 may be quickly disengaged from the storage area 30 and replaced with other cells 31 having different sizes.

FIGS. 12A through 12D further illustrate the functionality of the manipulator 33 according to an exemplary embodiment of the present inventive concept. As illustrated therein, the manipulator 33 may be configured for three-dimensional movement, such that the manipulator 33 may align with a desired cell 31 and engage with the tray 32 stored therein, as illustrated in FIGS. 12A through 12D. The manipulator 33 may be, for example, connected to a set of beams or tracks, allowing for movement along x, y, and z axes through the storage area 30. In an exemplary embodiment of the present general inventive concept, the manipulator 33 may include multiple components to handle motion along different axes, for example an elevator 33a to control up-and-down motion (z-axis), a set of rails 33b to control side-to-side motion (x-axis), and a transport plate 33c to extend to and support the tray 32 (y-axis).

According to an exemplary embodiment of the present inventive concept, the manipulator 33 may engage with a tray 32 by aligning with the cell 31 and then extending the transport plate 33c, an actuator, or other device to connect with the engagement point 39 of the tray 32. As described above, this engagement may be mechanical, for example by a hook or claw attaching to a handle or socket, or non-mechanical, for example by a magnet or electromagnet. Once engaged with a tray 32, the manipulator 33 may draw the tray 32 out from the cell 31 (FIG. 12B), and carry the tray 32 to a position directly below the closed door 12 of the platform 10 (FIG. 12C; door 12 not illustrated in order to show position of tray 32). The door 12 can then open as described above and allow the tray 32 to be raised up through the opening 13 via the elevator 33a of the manipulator 33 (FIG. 12D). Once the tray 32 is raised up through the opening 13, the gantry arms 20,50 can move to grasp the UAV supported on the tray 32 and move the UAV off the tray 32 and over the platform 10. Once the arms have engaged with the UAV, the manipulator 33 may lower the tray 32 away from the opening 13, thereby disengaging the UAV from the tray 32 and allowing the door 12 to close. The gantry arms 20,50 may then position the UAV on the platform 10 for deployment, as described above.

Similarly, when a UAV has landed on the platform 10 from flight and must be retrieved and stored, the manipulator 33 may retrieve the corresponding tray 32 and raise it up to the door 12, which can open as described above. The gantry arms 20,50 may change the orientation of the landed UAV as described above. Preferably, the gantry arms 20,50 move the UAV such that data and power ports on the UAV will line up with and engage with socket(s) 36 on the tray 32, and the feet 25 will align with the slots 35 on the tray 32. The gantry arms 20,50 may move the oriented UAV to the tray 32 and release the UAV by moving away from it, thereby depositing the UAV onto the tray 32. In an exemplary embodiment, the gantry arms 20,50 may move the UAV into position over the opening 13 and the manipulator 33 may then lift the tray 32 up to engage with the feet 25 and power/data ports of the UAV, after which the gantry arms 20,50 may release the UAV. Once the UAV is engaged by the tray 32 and released by the gantry arms 20,50, the manipulator 33 may then move the tray 32 carrying the UAV away from the opening 13, allowing the door 12 to close while the manipulator 33 carries the tray 32 back to the corresponding cell 31.

Figure 13A:
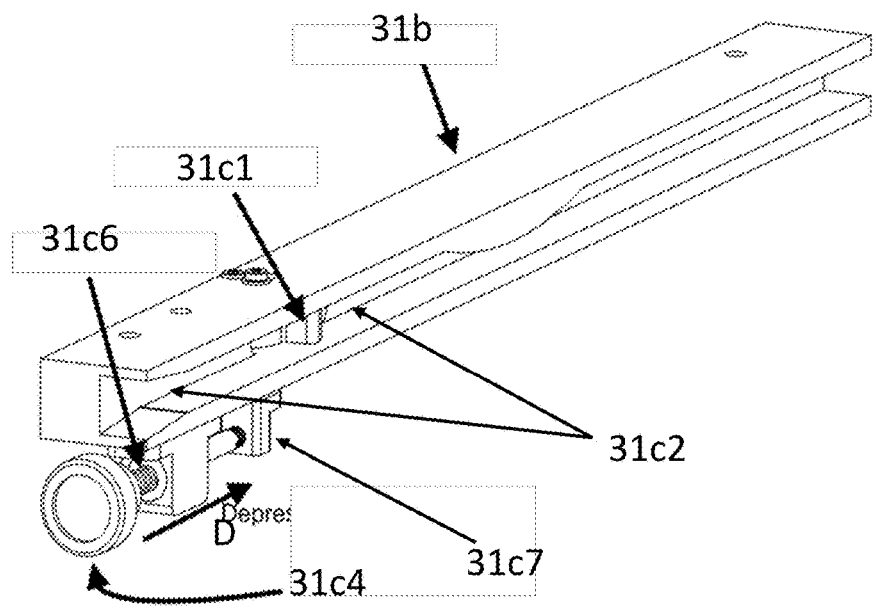
FIG. 13A illustrates a perspective view of a rail useable with the system according the exemplary embodiments of FIG. 1 and FIG. 12.
Figure 13B:
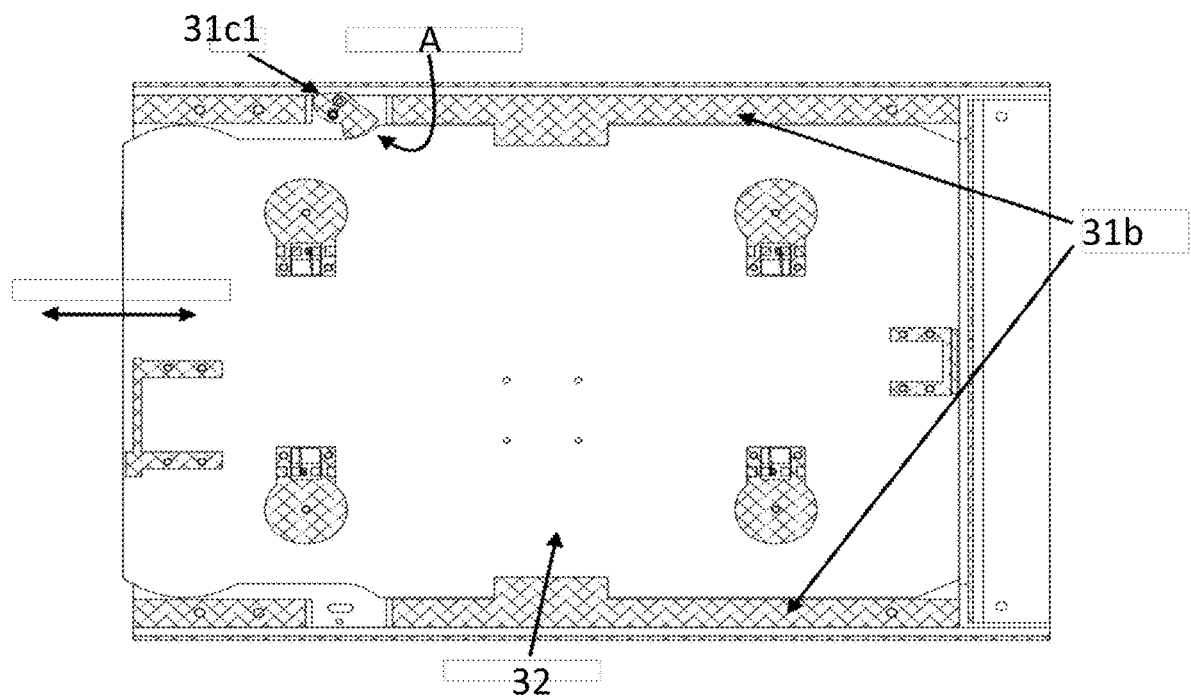
FIG. 13B illustrates a top view of a tray useable the system according the exemplary embodiments of FIG. 1 and FIG. 12.
Figure 13C:
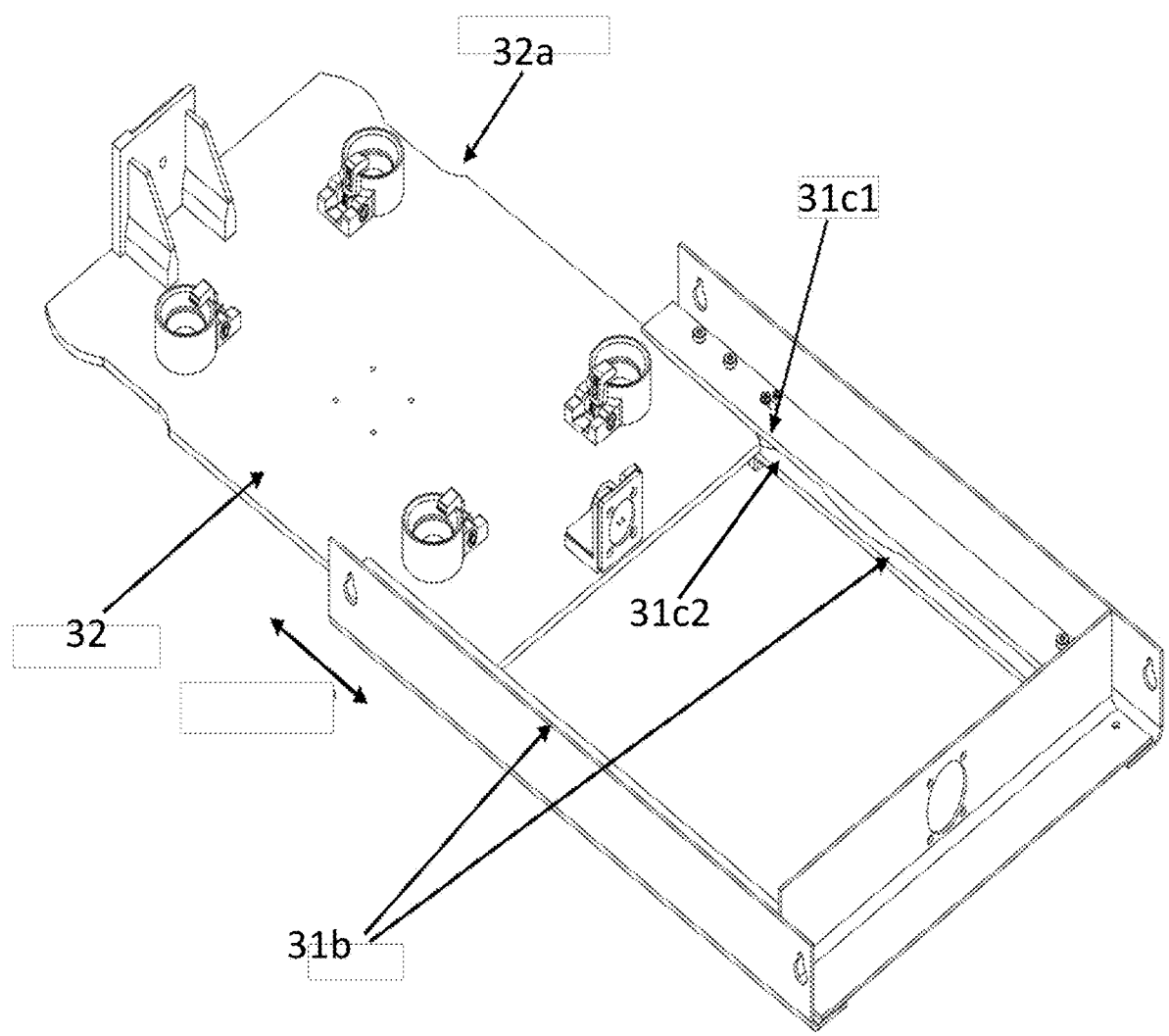
FIG. 13C illustrates a top view of the operations of the rail of FIG. 13A with the tray of FIG. 13B.

FIGS. 13A through 13C show details of the locking mechanism 31c as briefly discussed and illustrated as illustrated with reference to FIG. 12A and FIG. 12B. Referring to FIG. 13A, at least one rail 31b per cell 31 can include a cam 31c1 fixed within a slot 31c2 of the rail 31b. The cam 31c1 can rotate on a rotation axis 31c3, and is biased to a position to interfere with the slot 31c2 of the rail 31b. A cam unlock linkage 31c4 can be connected underneath an outer end of the rail 31b with respect to its corresponding cell 31. A tray 32 can be inserted and removed from a corresponding set of rails 31 via respective slots 31c2 along each rail 31b, as illustrated in FIG. 12C. The cam unlock linkage 31c4 can include a first end with a knob 31c5 and a linkage spring 31c6 which biases the cam unlock linkage 31c4 outward. When the cam unlock linkage 31c4 is pushed in a depress direction D to unlock the cam 31c1, the linkage spring 31c6 will bias the unlock linkage 31c4 in an opposite direction back outward toward its original "locked" position as illustrated in FIG. 13A. When the cam unlock linkage 31c4 is pushed in the direction D, a second end thereof, opposite the first end including the knob 31c4, will bias a lever 31c7, which in turn will rotate the cam 31c1 from its locked position to an open position to clear the slot 31c2 such that the inserted tray 32 can be freely withdrawn from its cell 31. When a tray 32 is being inserted along the rails 31b as illustrated in FIG. 13C, the cam 31c1 will be biased by the tray 32 to rotate to an open position where the cam 31c1 is not blocking the slot 31c2 so that the tray 32 can be slid completely into the cell 31. The lever 31c7 is connected to the cam 31c1 such that when biased by pushing the knob 31c5, the lever 31c7 will force the cam 31c1 to rotate to its open position so that the tray 32 can be removed from the cell 31. The cam's 31c1 resting position is at the locked position so that a tray 32 that is fully placed in the cell 31 will be prevented from sliding out of the cell 31 by a cam contact area A, as illustrated in FIG. 13B. The cam contact area A will make contact with the tray contact area 32a illustrated in FIG. 13c. When the cam contact area A is in contact with the tray contact area 32a, the tray 32, with or without a UAV connected thereto, will be securely fastened in a respective cell 31 until the knob 31c5 is pushed in the depression direction D, which will in turn push the lever 31c2 to rotate the cam 31c1 to its open position where the cam contact area A will rotate into the rail slot 31c2 so that the tray 32 is free to be withdrawn from its cell 31.

Figure 14A:
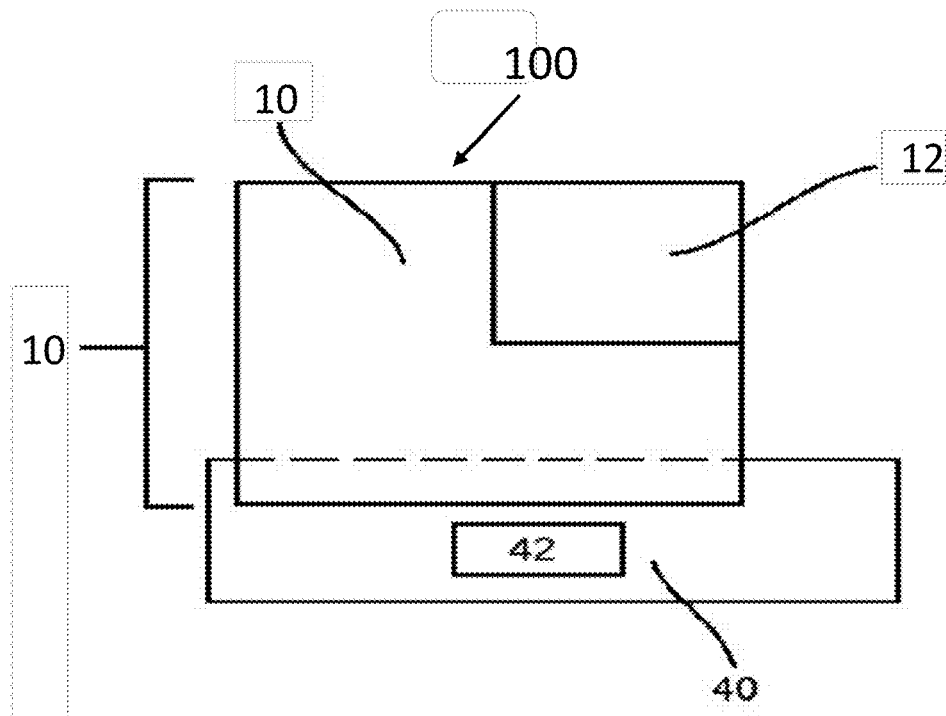
FIG. 14A illustrates a top view of view of the system according to the exemplary embodiment of FIG. 1 integrated with a controller in accordance with an exemplary embodiment of the present inventive concept.
Figure 14B:
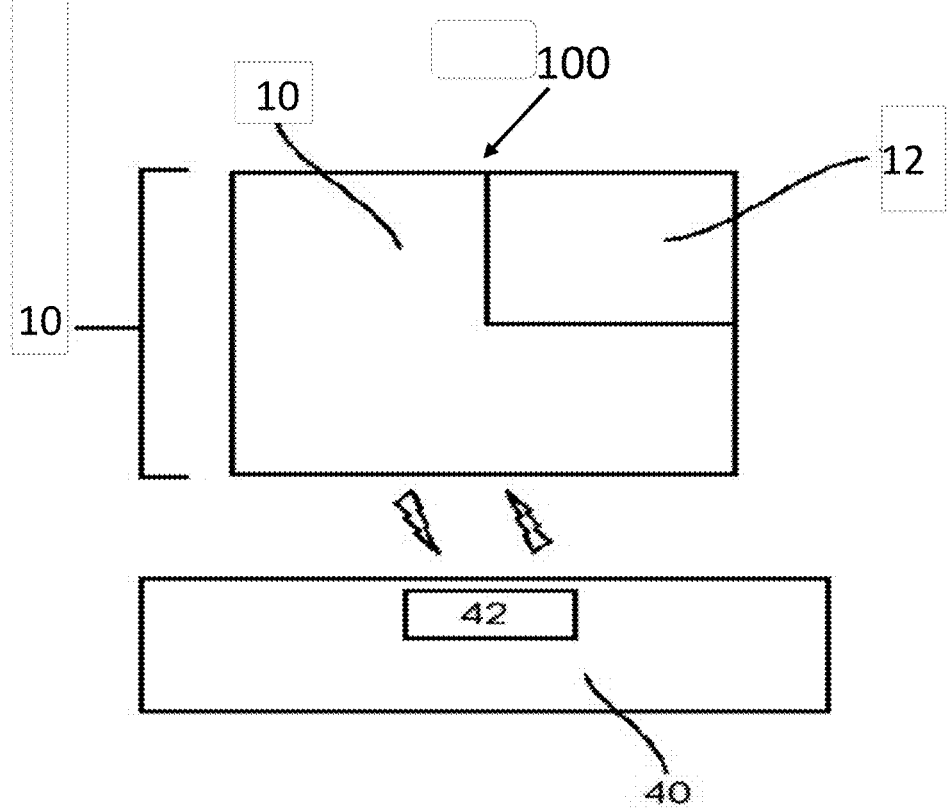
FIG. 14B illustrates a top view of view of the system according to the exemplary embodiment of FIG. 1 working in a non-integrated manner with the controller illustrated in FIG. 14A.

The system 100 according to various embodiments of the present inventive concept may also include a controller 40. The controller 40 may be, for example, a computer, machine, device, circuit, component, or module, or any system of machines, devices, circuits, components, modules, or the like, which is/are capable of manipulating data according to one or more instructions, such as, for example, without limitation, a processor, a microprocessor, a central processing unit, or the like. FIGS. 14A and 14B illustrate a top-down views of two separate exemplary embodiments of the system 100 including the controller 40. As illustrated in the exemplary embodiment of FIG. 14A, the controller 40 may be integrated with the rest of the system 100. Alternatively, as illustrated in FIG. 14B, the controller 40 may be separate, communicating with the rest of the system 100 by a wired or wireless communication. The controller 40 may control the operations of the system 100 to handle UAV retrieval and deployment. The controller 40 may control the gantry arms 20,50 as described above, according to input from the sensors 24 mounted thereon. Similarly, the controller 40 can control the manipulator 33 as described above.

Referring back to FIGS. 1 and 2, the system 100 may further include one or more sensors 41, which track the location and speed of UAVs relative to the platform 10. The sensor(s) 41 may be, for example, one or more cameras for image processing with object or IR tracking, a global positioning system (GPS), radar, lidar, UWB (ultra wide band) positioning, or any other sensing device. The sensor(s) 41 may also include, for example, weather sensors (e.g., windspeed sensors, humidity sensors, thermometers, etc.) to determine weather conditions, as well as accelerometers and/or position sensors to determine the motion of the platform 10, for example if the system 100 is mounted on a moving vehicle, boat, etc. The sensors 41 are illustrated in FIGS. 1 and 2 as being located on the ends of the tracks 29 of the gantry arms 20, but it will be understood that the sensors 41 may be in any suitable location depending on their respective functions.

The controller 40 according to the two exemplary embodiments of FIGS. 14A and 14B may also include a communication interface 42 to allow the controller 40 to establish a communication link with UAVs. The communication interface 42 may be any device or combination thereof that allows for wireless communication with one or more UAVs. Via the communication interface 42, the controller 40 may establish a communication link with one or more UAVs to transmit and receive data. In an exemplary embodiment, the controller 40 may receive a request via the communication interface 42 from a UAV to land at the system 100. The controller 40 may then receive environmental data via the sensors 41 to determine a relative position solution, i.e., a flight plan for the UAV to successfully land on the platform 10. This environmental data may include, for example, the position and velocity of a UAV relative to the platform 10, accounting for factors such as the movement of the platform 10 itself, as well as other factors such as, for example, wind speed and direction. The controller 40 may transmit this environmental data to the UAV to enable the UAV to calculate a relative position solution to land on the platform 10. Alternatively, the controller 40 may calculate a relative position solution and transmit this calculated relative position solution to the UAV, which can be useful when the UAV lacks the processing power to calculate the relative position solution on its own. In an exemplary embodiment, the UAV uses the calculated relative position solution to land approximately in the center of the platform 10. After landing, the UAV may disarm itself by turning off its propellers, and signal to the controller 40 that it is ready to be picked up by the gantry arms 20,50 and accepted into a cell 31 of the storage area 30. In another exemplary embodiment, the UAV may turn off its propellers upon instruction by the controller 40, which subsequently controls the gantry arms 20 to pick up the UAV.

The controller 40 may similarly provide environmental data to the UAV during deployment to allow for a more efficient deployment/launch. For example, the controller 40 may provide data or flight plans to the UAV to allow it to compensate for wind or motion of the platform 10 during deployment.

The controller 40 may provide the environmental data and/or relative position solution to a UAV in a single transmission. Alternatively, the controller 40 may provide and/or update this data at regular intervals. According to another exemplary embodiment, the controller 40 may stay in constant communication with a UAV during retrieval and deployment, providing updates on the UAV's relative position and speed with regard to the platform 10, and updating the environmental data and/or relative position solution. This may allow smoother and more reliable UAV retrieval and deployment.

The controller 40 may also communicate to the UAV after it has landed, to instruct the UAV to power down its propellers before the gantry arms 20 interact with it, as noted above. Similarly, the controller 40 may inform the UAV when it is free to take off, i.e., when the gantry arms 20 have released it on the platform 10, such that the UAV is clear to start its propellers without damaging itself or any part of the system 100.

The controller 40 may also communicate with the UAVs in the storage area 30. This communication may be via the wireless communication interface 42, or via the sockets 36 in each tray 32. In this manner, the controller 40 and stored UAVs may exchange data between each other, for example mission instructions, flight data, images, sensor data (e.g., air temperature, wind speeds, radiation levels, moisture content, air density, contaminants, etc.), video, audio, and/or any other relevant data.

The controller 40 may also maintain a registry of UAVs serviced by the system 100. This registry may include, for example, size and type of each UAV. Registration of a UAV may be performed in advance, or may be performed upon request. For example, if a UAV requests landing at the system 100, as part of this request the UAV may provide, e.g., data regarding its size and type, so that the controller 40 may add this data to the registry. The controller 40 may also maintain a list of which types of UAV the system 100 may service, so that these requests may be processed accordingly, e.g., an incompatible UAV attempting to land may be denied landing, or an alert message may be sent to an operator.

The registry maintained by the controller 40 may further include the capabilities, i.e., UAV compatibilities, of each cell 31 and tray 32 in the storage area 30. Similarly, the registry may store the location (i.e., cell 31 and tray 32) of each UAV stored in the storage area 30. Accordingly, when a UAV is requested by, for example by an operator, the controller 40 may control the manipulator 33 to retrieve the tray 32 carrying the requested UAV from the corresponding cell 31. Similarly, when a UAV returns to the system 100 to land it may send a request-to-land signal. The controller 40 may check the registry for a compatible empty tray 32 in the storage area 30. If the request-to-land signal is accepted and a compatible empty tray 32 is found, then the controller 40 indicates to the UAV and software package that is controlling the UAV that it has permission to land. The UAV may then land and be stored as described above.

Since the controller 40 controls all components of the system 100, the controller 40 may synchronize the system 100's operations to increase efficiency. For example, when a UAV lands on the platform 10, the controller 40 may control the manipulator 33 to retrieve the corresponding tray 32 and move the tray 32 into position under the door 12 while simultaneously controlling the gantry arms 20 to manipulate and engage with the UAV. This synchronization allows the system 100 to more efficiently service multiple UAVs.

The controller 40 can also function as a communication hub, receiving input from one or more deployed UAVs. The controller 40 can store and/or transmit this data to an external terminal, for example an operator's computer, via the communication interface 42 or other communication device. Similarly, the controller 40 can receive instructions, for example a flight plan, from an external terminal and relay these instructions to a UAV. This allows a remote human operator to control one or more UAVs through the system 100 without needing to be physically present.

Mission operation may be performed through a software API (application program interface). This allows the controller 40 to interface with UIs (user interfaces) of different UAVs, such that operators may send direct commands to the UAVs via the respective UIs while all being coordinated by the same controller 40. The controller 40 can also interface with automated software packages that do not use operator inputs directly. An example of such an automated software package is a perimeter security system that scans for motion and requests a UAV to a location when movement is detected. Any number of different control software packages can be used simultaneously, coordinated through the controller 40. The system 100 according to an exemplary embodiment of the present inventive concept can therefore act as a base station of resources that can be requested for a given application on demand.

The controller 40 can also monitor the status of UAVs registered to the system 100, enabling increased efficiency of operation. For example, via the wireless interface the controller 40 can monitor the battery levels of UAVs that have been deployed. If the controller 40 determines that a UAV power levels have fallen below a certain threshold, or alternatively a UAV notifies the controller 40 that its power levels have fallen below the threshold, the controller 40 can control the system 100 to deploy another UAV to relieve the currently-deployed UAV. According to an exemplary embodiment, the "relief" UAV having charged batteries can be directed by the controller 40 to fly into proximity with the "deployed" UAV having depleted batteries. After optionally sending a notification to an operator, a data feed, e.g., a video feed, being received at the controller 40 from the deployed UAV may be stopped while simultaneously starting an identical data feed from the relief UAV to the controller 40. Similarly, control from an operator may be switched from the deployed UAV to the relief UAV, such that the operator may control the relief UAV. In other words, the relief UAV may take over the job of the deployed UAV. The deployed UAV may then return to the system 100 for retrieval and recharging. In an exemplary embodiment, an operator receiving the data feed experiences no interruption of service—as one data feed ends, another identical one begins. This enables "persistence through mission sharing," or prolonged missions and cooperative use of UAVs.

When a launch command is received, the controller 40 may check the available UAVs to determine if one is ready to be deployed. Parameters such as battery level, maintenance schedule, sensors/payloads ready, and others are checked to verify deployment readiness. An operator can request a specific UAV by name or the operator can request any suitable UAV that meets some threshold of performance. This may be, e.g., maximum flight time, flight speed, or sensor type. According to some aspects of the disclosure, UAVs with varying payloads can be stored and requested based on the type of mission. After a UAV is selected for deployment, the controller 40 may identify the cell 31 that the vehicle is stored in and retrieve and deploy this UAV according to the processes described above.

While stored in storage area 30, UAVs may have batteries charged and payloads reloaded. The storage area 30 may include a payload manipulation component, e.g., one or more arms, configured to add a payload, remove a payload, modify a currently mounted payload on a UAV, and/or other payload manipulations. For example, the payload manipulation component may be configured to load or remove payloads such as mail, supplies, scientific samples (e.g., soil, ice samples, etc.), and/or any other payloads. The payload manipulation component can also be configured to add or remove components of the UAVs themselves, for example sensors and battery cells 31 (see FIG. 12A).

According to an exemplary embodiment of the present inventive concept, as illustrated in FIG. 12A, the storage area 30 may include one or more other sectors 34 for maintenance and modification of UAVs. In an exemplary embodiment, the storage area 30 may include a sector 34 set aside for maintenance, and another sector 34 set aside for inspection of UAVs. A tray 32 carrying a UAV may be moved into these sectors 34 by the manipulator 33, wherein the UAV on the tray 32 may be modified, inspected, and so on. The payload manipulation component may be included in one of these sectors 34.

In accordance with exemplary embodiments herein, an automated retrieval and deployment system 100, such as the ones described herein, may create significant capabilities for small autonomous aircraft. Persistent missions will extend operator on-task times by orders of magnitude, multiplying the effectiveness of UAVs currently in use. Deployment and retrieval from a moving platform will enable a range of applications that were previously not achievable.

The automated retrieval and deployment system 100 may further be enclosed and weatherproof, such that only the platform 10 and gantry arms 20 are exposed to the elements. This allows the automated retrieval and deployment system 100 to be placed in hostile environments with a reduced risk of damage.

The automated retrieval and deployment system 100 may also allow for rapid or "pop-up" setup. The automated retrieval and deployment system 100 may be positioned anywhere there is room for it and there is a power supply. The automated retrieval and deployment system 100 may be constructed to be modular and readily disassembled and reassembled. For example, wires in the automated retrieval and deployment system 100 may include plugs to allow rapid unplugging and plugging in, whereas the platform 10 and storage area 30 may be constructed to be broken down into two or more parts which can then be transported and reassembled. This construction allows the automated retrieval and deployment system 100 to be more easily transported to a desired location.

The automated retrieval and deployment system 100 may also be scaled to any desired size—a larger automated retrieval and deployment system 100, including a corresponding larger platform 10 and larger storage area 30, may accommodate more UAVs and/or larger UAVs. Conversely, a smaller automated retrieval and deployment system 100 may be more easily transported, allowing for efficient pop-up installation of the system 100 and deployment of UAVs.

The automated retrieval and deployment system 100 may configure itself upon activation to account for its size. For example, when the controller 40 is activated, it may control the gantry arms 20,50 to move through a preset pattern, using the sensors 24 in the gantry arms 20,50 to determine the size and shape of the platform 10 so that the controller 40 may account for this size and shape during operation of UAVs. In other words, the automated retrieval and deployment system 100 size may be modified as necessary without disrupting operations.

By deploying a series of automated retrieval and deployment systems 100 according to exemplary embodiments of the present inventive concept, an operational range of UAVs may be greatly extended. For example, a UAV deployed from a first automated retrieval and deployment system 100 may request landing at a second automated retrieval and deployment system 100, and may land at the second automated retrieval and deployment system 100 for recharging and subsequent redeployment, thereby allowing the UAV to travel much further from its "home" automated retrieval and deployment system 100 than would normally be allowed by the UAV's relatively short operational range.

Figure 15:
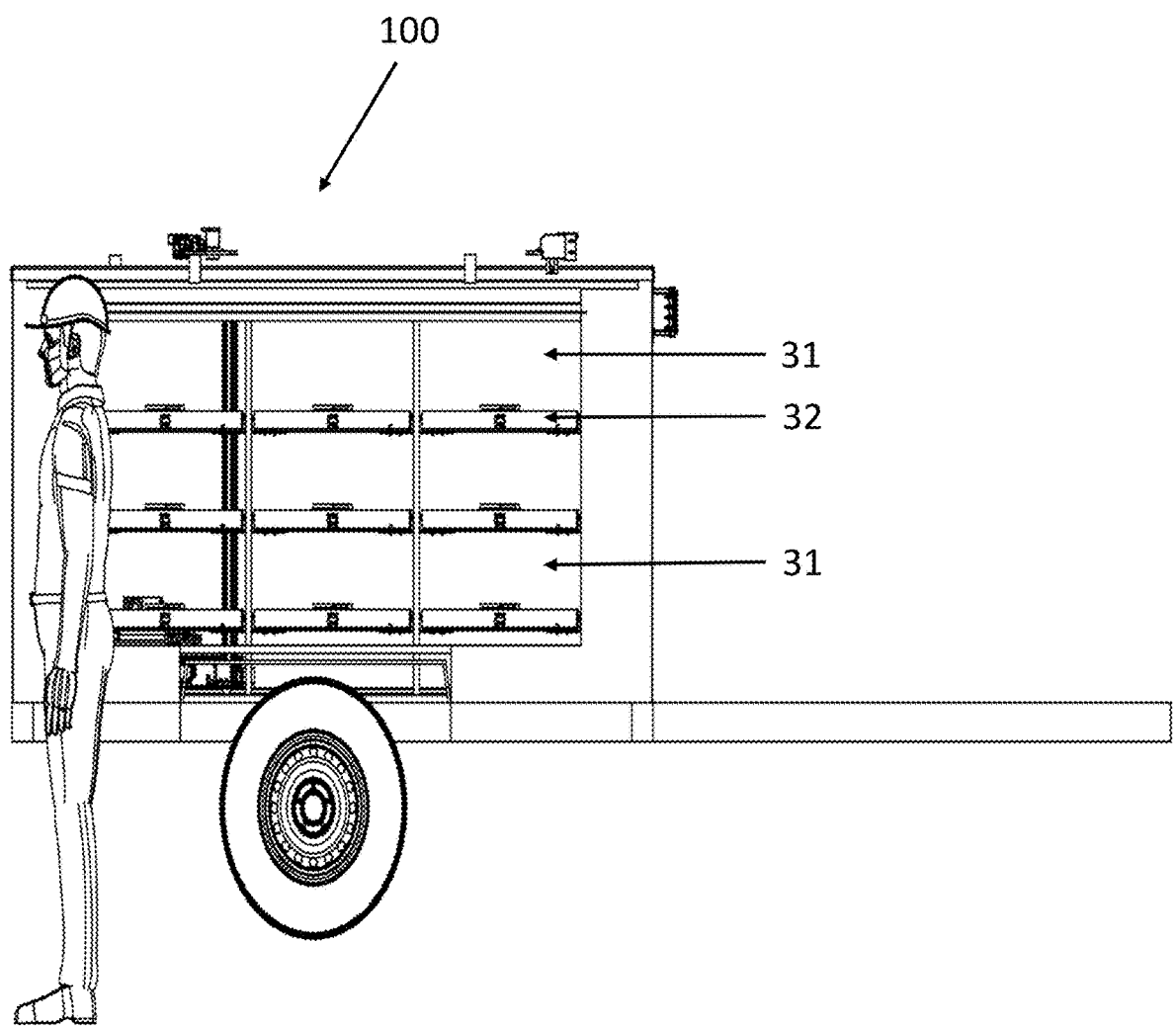
FIG. 15 illustrates a side view of a system to launch, retrieve, store and communicate with unmanned air vehicles (UAVs) according to an exemplary embodiment of the present inventive concept, mounted on a trailer.

FIG. 15 illustrates a side view of an automated retrieval and deployment system 100 according to various exemplary embodiments of the present inventive concept, which can be connect to a trailer or similar mobile vehicle for transport to any desired terrain where UAVs are desirable. As a result of the safety features such as the rails 31b and locking mechanism 31c to hold the corresponding tray 32 in place, and the supports 38 to maintain the propellers stationary, as described supra, the UAVs can easily handle transportation along most any terrains.

Figure 16:
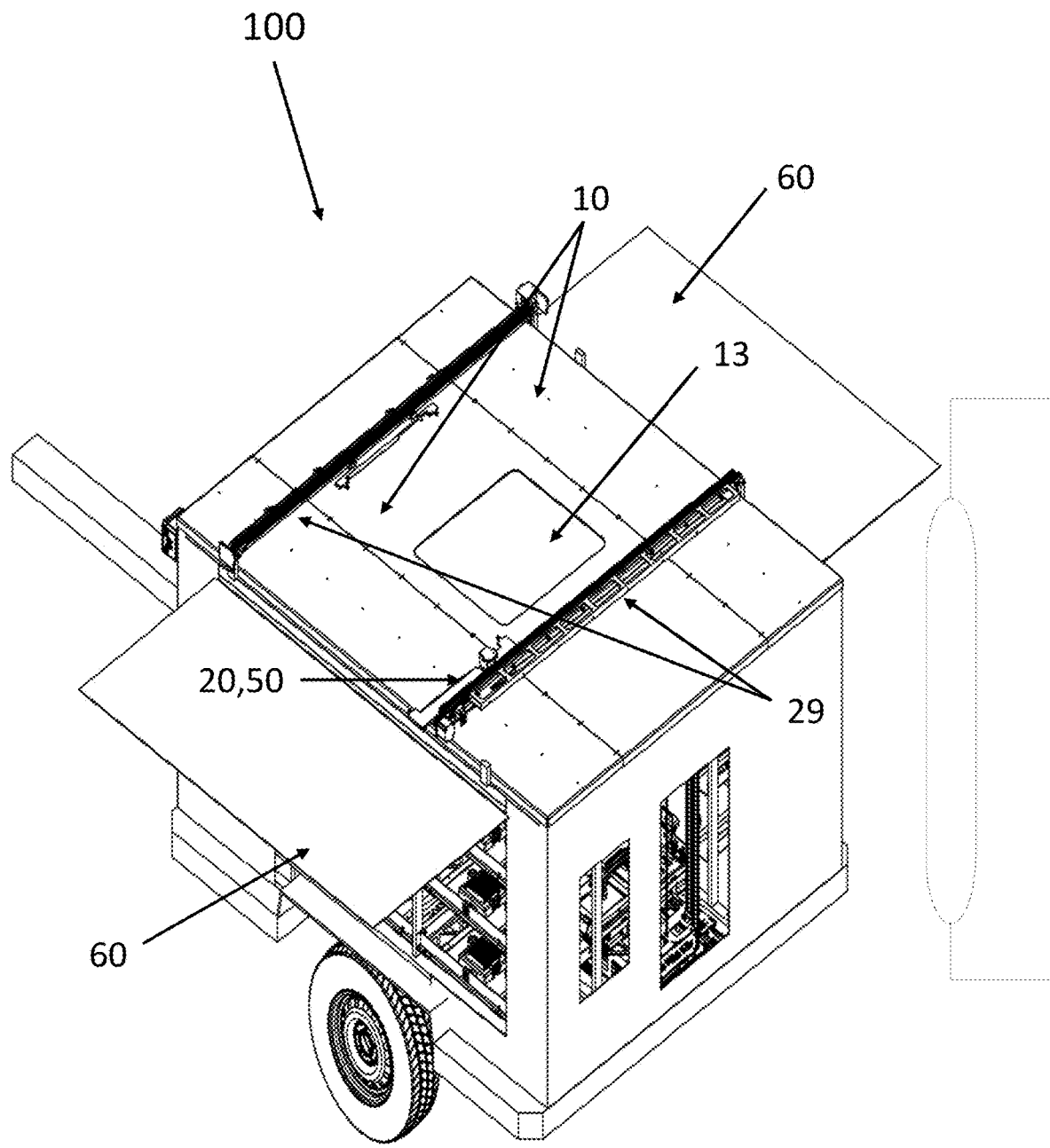
FIG. 16 illustrates a perspective view of the system according to the exemplary embodiment of FIG. 15, mounted on a trailer.

FIG. 16 illustrates a top view of the automated retrieval and deployment system 100 of FIG. 15, where the gantry arms 20,50 are exposed along corresponding rails 29, and the door 12 is in the fully open position, thus not visible, but instead exposing the opening 13 through which the UAVs can be stored in the system and withdrawn from the system 100. In this example embodiment side doors 60 can open and close to expose the UAVs within the system 100 for access thereto. The doors 60 also provide for convenience of maintenance of the interior of the system 100. When designed to be mounted on a trailer such as illustrated in FIGS. 15 and 16, the automated retrieval and deployment system 100 has been manufactured to hold 18 UVAs. However, the automated retrieval and deployment systems 100 according to the exemplary embodiments as described herein can be manufactured to hold a larger or smaller number of UAV's depending on the uses thereof.

Through use of the system 100 to enable persistent missions as above, an operator may stay on task and is free to perform lengthy operations. Initial applications may include inspection tasks on power lines and wind turbines as well as persistent eye-in-the-sky tasks for police and news stations.

Exemplary embodiments of the system 100 according to the present disclosure enable swarming capabilities and a force multiplication effect where relatively few operators can perform abstracted tasks such as observation of a large area. With the automated retrieval and deployment system 100, the time to deploy a UAV may be reduced substantially and the preparation time may be, e.g., zero. Significant numbers of UAVs can reach the sky simultaneously only limited by the duty cycle of the automated retrieval and deployment system 100. Current estimates (e.g., 15 min flight; 10 s retrieval/deployment; 1 arm) would put 45 drones in the air; a number that is positively coupled with battery technology and would increase over time. Large numbers of UAVs in the air simultaneously will create new applications that haven't yet been explored. Fire monitoring, situational awareness, and search and rescue missions would benefit with more sensors and cameras in the air. Furthermore, a single operator may control and manage multiple UAVs efficiently, since the controller 40 can automate the often complicated processes of retrieval and deployment, as well as monitoring the condition (e.g., battery level) of each UAV. Since UAVs can be recalled and replaced automatically, a network of UAVs can be "self-healing," i.e., UAVs can be efficiently replaced as needed.

The automated retrieval and deployment system 100 may also enable swarming persistent missions from moving vehicles in civilian and military applications. Applications may include, e.g., search and rescue missions while driving through a backcountry; multiple camera angles per sailboat in a boat race; situational awareness tools for a moving convoy; wildfire monitoring equipment from a valuable vantage point; and monitoring a moving target, such as a motorcade.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A system to manage unmanned air vehicles (UAVs); comprising:
   an enclosed storage area including at least one cell formed therein to receive and store at least one UAV;
   a platform to receive a UAV from a flight and to support a UAV for launching, the platform including an electronic door to act as a part of the platform, the door being configured to retract under the platform to create an opening in the platform to allow UAVs to move along the platform to a position over the opening and enter and exit the storage area; and
   a pair of gantry arms movable to pickup and position a UAV anyplace along the platform and over the opening.

2. The system according to claim 1, further comprising:
   a first pair of guide rails to guide movement of the pair of gantry arms across the platform; and
   a second pair of guide rails disposed at opposite ends of the platform to guide movement of the pair of gantry arms across the platform in a direction perpendicular to the direction in which the first pair of guide rails guide movement of the gantry arms.

3. The system according to claim 2, wherein the gantry arms include:
   a pair of notches disposed at each of two opposite ends thereof to capture feet of a UAV disposed on the platform, each pair of notches including a point extending outward disposed therebetween;
   an alignment pin adjacent one pair of notches and the point to capture a foot of the UAV therein; and
   a blade disposed adjacent to the other pair or notches and the point to engage with slots in the feet of a UAV, the blade being angled to lift the feet by a predetermined amount.

4. The system according to claim 2, wherein the gantry arms include:
   a pair of notches with a point therebetween at each of two opposite ends thereof to capture feet of a UAV on the platform;
   a wedge adjacent one pair of notches and the point to capture a foot of the UAV therein; and
   a blade disposed adjacent to the other pair or notches and the point to engage with slots in the feet of a UAV, the blade being angled to lift the feet by a predetermined amount.

5. The system according to claim 2, wherein the door drops down by a predetermined amount with respect to the platform and then slides thereunder along tracks.

6. The system according to claim 2, wherein the first pair of guide rails glide along a length of the second pair of guide rails to move the corresponding arms along the second pair of guide rails.

7. The system according to claim 2, further comprising:
   a chute disposed at one side of the system to capture an object that is removed from the platform by the gantry arms.

8. The system according to claim 2, wherein the storage area comprises a plurality of cells vertically aligned, each cell to receive and store a UAV therein.

9. The system according to claim 8, wherein each cell includes:
   a pair of rails disposed at opposite sides thereof, each rail including a slot therein; and
   a tray to securely connect a UAV thereon, the tray being configured to slide along the slot in the pair of rails to place the UAV with the cell and withdraw the UAV from the cell.

10. The system according to claim 9, wherein one of each pair of rails includes a locking mechanism within the slot, the locking mechanism including a cam to rotate to an open position to allow the tray to slide past the locking mechanism and into the cell and to rotate to a lock position where a contact area thereof extends out of the slot to contact and lock the tray from sliding out of the cell.

11. The system according to claim 10, wherein the locking mechanism further comprises:
    a lever disposed at one end of the rail where the tray enters the cell, the lever being configured to prevent the cam from rotating to the open position; and
    an unlocking linkage disposed at the one end of the rail and adjacent the lever, the unlocking linkage including a spring to bias the unlocking linkage away from the lever, the unlocking linkage being configured such that when a force greater than a force of the spring is applied thereto, the unlocking linkage forces the lever to move to a position to release the cam such that the cam rotates to the open position such that the tray can be withdrawn from the cell.

12. The system according to claim 11, wherein the storage area further comprises;
    a manipulator to manipulate a tray between any of the cells and the opening in the platform, the manipulator being configured to move a tray to a position within the opening such that the gantry arms can engage with feet of a UAV disposed on the tray.

13. The system according to claim 12, wherein the manipulator further comprises:
    a transport plate to receive the tray;
    an elevator to raise and lower the transport plate between the opening in the platform and a position adjacent to each of the cells vertically aligned; and
    a pair of rails that move with the elevator, the rails being configured such that the transport plate can slide along the rails horizontally between a position directly under the opening to a position between the pairs of rails within each of the cells.

14. The system according to claim 13, further comprising:
    an electronic controller to control movements of the first and second pair of guide rails, the door and the manipulator.

15. The system according to claim 14, wherein the electronic controller is connected to the system physically and with wires.

16. The system according to claim 14, wherein the electronic controller is remote from the system physically and is wirelessly connected to the system.

17. A system to manage unmanned air vehicles (UAVs); comprising:
    an enclosed frame including a plurality of movable cells formed therein, each cell being movable to be enlarged or made smaller to fit different size UAVs;
    a platform disposed on a top portion of the enclosed frame to receive UAVs upon landing and to support a UAV to be launched, the platform including one portion thereof that is configured to withdraw from the rest of the platform to create an opening to allow UAVs to enter and exit the enclosed frame; and
    a pair of gantry arms movable along the platform to pickup a resting UAV and position the picked up UAV to anyplace along the platform or over the opening.

18. The system according to claim 17, further comprising a manipulator device to receive a UAV through the opening and move the UAV in vertical and horizontal directions within the enclosed frame and to place a received UAV into a cell corresponding with a size of the UAV.

* * * * *